(12) United States Patent
Matsushita

(10) Patent No.: US 11,350,551 B2
(45) Date of Patent: May 31, 2022

(54) OPERATION MANAGEMENT SYSTEM AND COMPONENT MOUNTING SYSTEM

(71) Applicant: YAMAHA HATSUDOKI KABUSHIKI KAISHA, Iwata (JP)

(72) Inventor: Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 141 days.

(21) Appl. No.: 17/042,028

(22) PCT Filed: Mar. 30, 2018

(86) PCT No.: PCT/JP2018/013708
§ 371 (c)(1),
(2) Date: Sep. 25, 2020

(87) PCT Pub. No.: WO2019/187033
PCT Pub. Date: Oct. 3, 2019

(65) Prior Publication Data
US 2021/0168977 A1    Jun. 3, 2021

(51) Int. Cl.
*H05K 13/08*     (2006.01)
*H05K 13/02*     (2006.01)
*H05K 13/04*     (2006.01)

(52) U.S. Cl.
CPC ......... *H05K 13/086* (2018.08); *H05K 13/021* (2013.01); *H05K 13/0452* (2013.01)

(58) Field of Classification Search
CPC . H05K 13/021; H05K 13/0452; H05K 13/086
See application file for complete search history.

(56) References Cited

U.S. PATENT DOCUMENTS

2016/0353621 A1   12/2016   Maezono et al.
2017/0354070 A1   12/2017   Kobayashi et al.

FOREIGN PATENT DOCUMENTS

| JP | 4385956 B2 * | 12/2009 |
| JP | 2012028660 A | 2/2012 |
| JP | 2015170801 A | 9/2015 |

(Continued)

OTHER PUBLICATIONS

International Search Report issued in PCT/JP2018/013708; dated Jun. 26, 2018.

*Primary Examiner* — Carl J Arbes
(74) *Attorney, Agent, or Firm* — Studebaker & Brackett

(57) ABSTRACT

A work management system includes a part resupply management unit that manages a plan of part resupply work and a collection management unit that collects waste material data and manages the collection work to be executed in future. The part resupply management unit includes a resupply target specifying unit that specifies a resupply time zone and a target mounting machine, and a work planning unit that extracts a plurality of the target mounting machines with the resupply time zones overlapping each other and that creates a work plan to make a patrol of the target mounting machines and execute the resupply work at the target mounting machines. When a need of the collection work to be executed has arisen at the target mounting machine, the work planning unit creates a work plan to execute both the resupply work and the collection work for the target mounting machine.

19 Claims, 18 Drawing Sheets

(56) References Cited

FOREIGN PATENT DOCUMENTS

| | | | |
|---|---|---|---|
| JP | 2016225385 | A | 12/2016 |
| JP | 2017216379 | A | 12/2017 |
| WO | 2004103052 | A1 | 11/2004 |
| WO | 2017208287 | A1 | 12/2017 |

* cited by examiner

FIG.9

| PRODUCTION ORDER (J11) | BOARD TYPE (J12) | PRODUCTION LOT (J13) | PRODUCTION VOLUME (J14) | PART ID (J151) | PART NAME (J152) | NUMBER OF REQUIRED PARTS (NUMBER/BOARD) (J153) | CYCLE TIME (SECONDS/BOARD) (J154) |
|---|---|---|---|---|---|---|---|
| 1 | BOARD A | L1 | A1 | PIA1 | PA1 | NA1 | CT1 |
|   |   |   |   | PIA2 | PA2 | NA2 | CT2 |
|   |   |   |   | PIA3 | PA3 | NA3 | CT3 |
|   |   |   |   | PIA4 | PA4 | NA4 | CT4 |
|   |   |   |   | PIA5 | PA5 | NA5 | CT5 |
|   |   |   |   | PIA6 | PA6 | NA6 | CT6 |
| ... | ... | ... | ... | ... | ... | ... | ... |

| MOUNTING MACHINE | COMPONENT SUPPLY DEVICE | | PART ID | NUMBER OF REMAINING COMPONENTS | WARNING NUMBER OF REMAINING COMPONENTS |
|---|---|---|---|---|---|
| | TYPE | DEVICE ID | | | |
| YO1 | AF | MIA1 | PIA1 | NA11 | NW1 |
| | AF | MIA2 | PIA2 | NA21 | NW2 |
| | AF | MIA3 | PIA3 | NA31 | NW3 |
| | TRAY | MIA4 | PIA4 | NA41 | NW4 |
| | TRAY | MIA5 | PIA5 | NA51 | NW5 |
| | STICK | MIA6 | PIA6 | NA61 | NW6 |
| ... | ... | ... | ... | ... | ... |

TIME SCHEDULE

RESUPPLY TIME: TH  — J31
NUMBER OF REELS: 4  — J32

D6

J33

| MOUNTING MACHINE NAME | POSITION OF COMPONENT SUPPLY UNIT | CARRIAGE ID | FEEDER ID | PART ID | PART NAME | WASTE MATERIAL COLLECTION |
|---|---|---|---|---|---|---|
| YO2 | BA | IDA | MIA1 | PIA1 | PA1 | REQUIRED |
|  |  |  | MIA2 | PIA2 | PA2 |  |
|  |  |  | MIA3 | PIA3 | PA3 |  |
|  |  |  | MIA4 | PIA4 | PA4 |  |
| ... | ... | ... | ... | ... | ... | ... |

J20, J34, J35, J36, J151, J152, J37

PRECEDING TAPE IS SUPPLIED FROM PRECEDING REEL

PRECEDING TAPE COMES OFF FROM PRECEDING REEL

PROBLEM HAS OCCURRED AT PRECEDING TAPE, READING REEL ID IS REQUIRED WHEN FITTING PRECEDING TAPE TO TAPE FEEDER AGAIN

LOADING TAPE FEEDER WITH SUBSEQUENT TAPE IS COMPLETED

OPERATION MANAGEMENT SYSTEM AND COMPONENT MOUNTING SYSTEM

CROSS-REFERENCE TO RELATED APPLICATION

This application is a National Stage of International Patent Application No. PCT/JP2018/013708, the entire content of which is incorporated herein by reference.

BACKGROUND

Technical Field

The present disclosure relates to a work management system that manages work of resupplying a component storage member to a mounting machine, which mounts components supplied from a component supply device attached with the component storage member on a board, and work of collecting waste materials related to the component storage member, and relates also to a component mounting system including the work management system.

Background Art

A mounting machine mounts electronic components (hereinafter simply referred to as "components") such as chips and ICs, on a board, such as a printed wiring board, to produce a component mounting board. This mounting machine has a component supply device that can be attached with a component storage member storing the components therein. In production of component mounting boards, a production line made up of a plurality of mounting machines is assembled, and parts are resupplied to the component supply device of each mounting machine according to a state of consumption of the components.

Meanwhile, as the components are consumed, waste materials related to the component storage member are generated at each mounting machine. For example, when the component storage member is a component supply tape, the waste materials include a carrier tape from which the components has been removed, a cover tape peeled from the carrier tape, and a reel having run out of the component supply tape wound around it. If these waste materials are not collected at proper timing, the waste materials overflow a waste material storage area of the mounting machine, raising a concern that it may affect the operation of the mounting machine.

In a conventional case of waste material collection, a worker visually checks the waste material storage area when making a patrol of the production line, and executes waste material collection when considering it necessary. JP 2017-216379 A discloses a component mounting system in which, when a new tape cassette for component supply is attached to a mounting machine, an empty tape cassette having supplied the entire components it carries is collected from the mounting machine. These conventional methods pose a problem that waste materials cannot be collected in a timely manner or that a worker needs to move for the sole purpose of waste material collection.

SUMMARY

Accordingly, the present disclosure provides a work management system that allows efficient execution of resupply work of resupplying a component storage member to a component supply device that a mounting machine has and collection work of collecting waste materials from the mounting machine, and to provide a component mounting system using the work management system.

A work management system according to an aspect of the present disclosure is a work management system that, on a production line including a plurality of mounting machines each provided with a component supply device to which a component storage member is attachable, each mounting machine mounting components supplied from the component supply device on a board to produce a component mounting board, manages resupply work of resupplying each mounting machine with the component storage member and collection work of collecting a waste material related to the component storage member from each mounting machine. This work management system includes a part resupply management unit configured to manage a plan of the resupply work for the component supply devices that the plurality of mounting machines have; and a collection management unit configured to collect waste material data on a state of generation of the waste material at the plurality of mounting machines, thereby managing the collection work to be executed in future, for each of the plurality of mounting machines. The part resupply management unit includes a resupply target specifying unit configured to monitor a state of component supply by each of the component supply devices, and specify a resupply time zone in which the resupply work is allowed to be executed and a target mounting machine to be subjected to the resupply work; and a work planning unit configured to extract a plurality of the target mounting machines with the resupply time zones overlapping each other, and create a work plan to make a patrol of the target mounting machines for executing the resupply work at the target mounting machines. The work planning unit is configured to refer to a state of management of the collection work by the collection management unit, and when a need of the collection work to be executed has arisen at the target mounting machine, create a work plan to execute both the resupply work and the collection work for the target mounting machine.

A component mounting system according to another aspect of the present disclosure includes a plurality of mounting machines each provided with a component supply device to which a component storage member is attachable, each mounting machine mounting components supplied from the component supply device on a board to produce a component mounting board; and the above work management system configured to manage resupply work of resupplying each of the plurality of mounting machines with the component storage member and collection work of collecting a waste material related to the component storage member from each mounting machine.

BRIEF DESCRIPTION OF THE DRAWINGS

FIG. 9 is a table format diagram showing an example of production plan information that is input to the work management system;

FIG. 10 is a table format diagram showing an example of mounting information that is input to the work management system;

DETAILED DESCRIPTION

A work management system and a component mounting system according to embodiments of the present disclosure will now be described with reference to the drawings.

[Overall Configuration of Component Mounting System]

Figure 1:
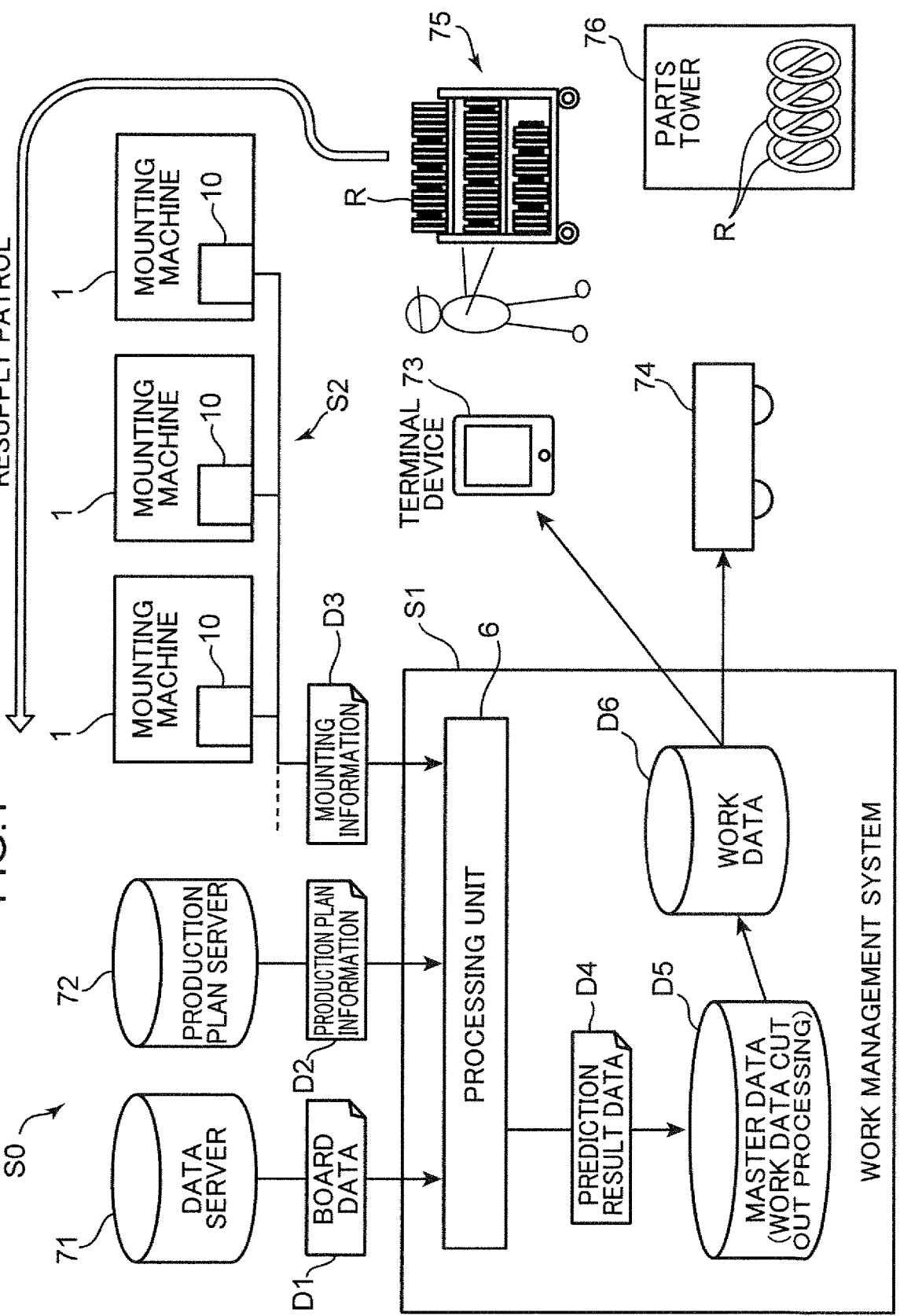
FIG. 1 is a schematic view of a configuration of a component mounting system according to one embodiment of the present disclosure.

FIG. 1 is a schematic view of a configuration of a component mounting system S0 according to one embodiment of the present disclosure. The component mounting system S0 includes a work management system 51, a production line S2 including a plurality of mounting machines 1, a data server 71, a production plan server 72, a terminal device 73 carried by a worker, and an automated guided vehicle (AGV) 74, i.e., unmanned carrier vehicle that carries parts, waste materials, and the like. The production line S2 is a line on which a plurality of mounting machines 1 are arranged in tandem and required components are mounted on a board to produce a component mounting board. The work management system 51 is a system that, on the production line S2, manages resupply work of resupplying each mounting machine 1 with a component storage member (e.g., a component storage tape 3, a component supply stick, a component supply tray, or the like, which will be described later) and collection work of collecting waste materials related to the component storage member (e.g., a waste tape from which components have been removed, an empty reel, an empty stick, an empty tray, and the like) from each mounting machine 1. Some of the above waste materials are collected to be reused. For example, the empty reel, the empty stick, the empty tray, and the like are collected and used again.

<Configuration of Mounting Machine>

Figure 2:
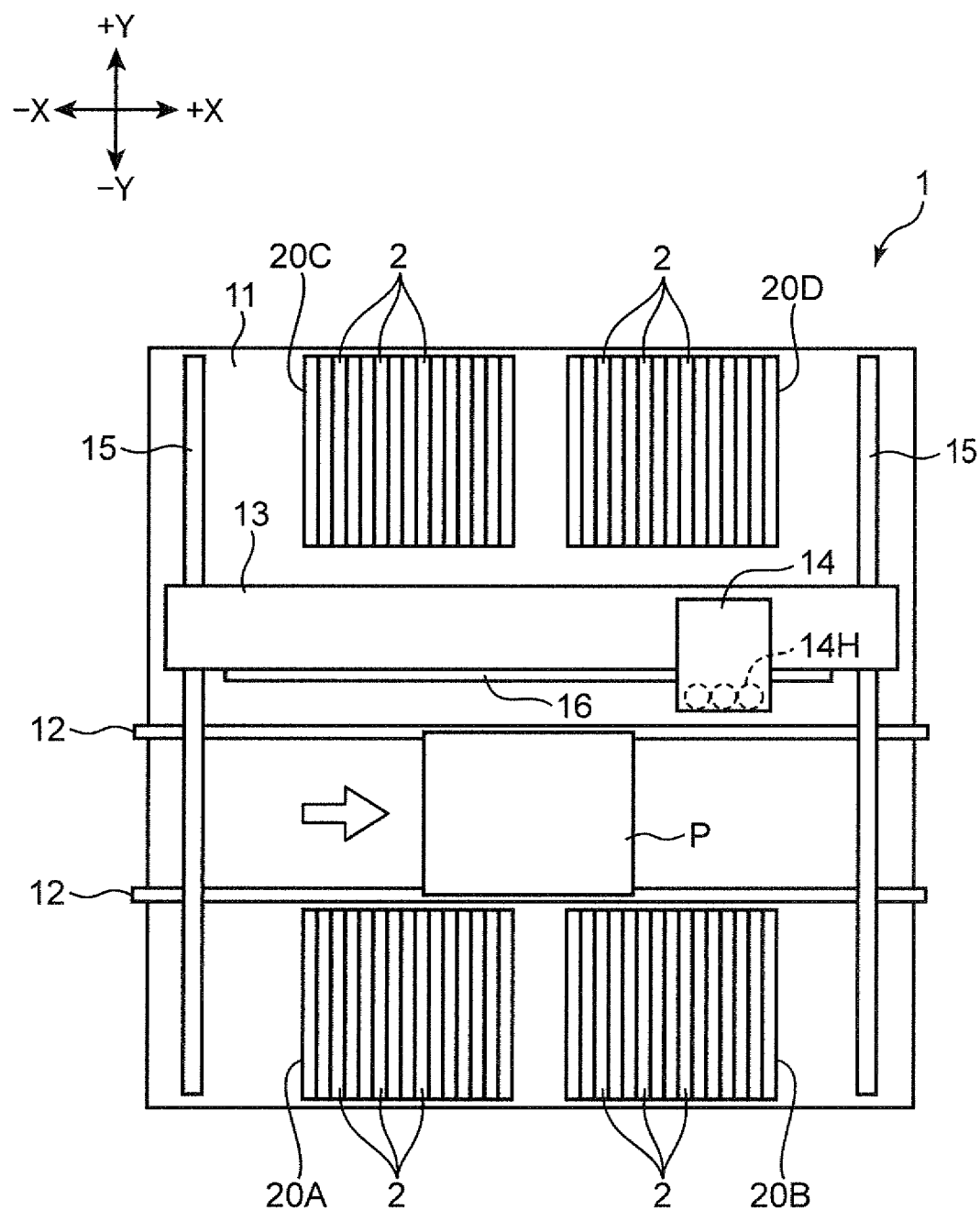
FIG. 2 is a plan view of a configuration of a mounting machine.

A configuration of the mounting machine 1 will first be described with reference to FIG. 2. FIG. 2 is a plan view of the configuration of the mounting machine 1. The mounting machine 1 is a device that mounts components on a board P, such as a printed wiring board, to produce a component mounting board. The mounting machine 1 includes a base 11, a pair of conveyors 12, a mobile frame 13, a head unit 14, Y-axis drive mechanisms 15, an X-axis drive mechanism 16, and component supply units 20A, 20B, 20C and 20D.

The base 11 is a rectangular base on which units constituting the mounting machine 1 are placed. The pair of conveyors 12 are conveyors that convey the board P, and are arranged on the base 11 so as to extend in the X direction. The conveyors 12 carry the board P from a −X side into the mounting machine 1, convey the board P toward a +X side until the board P reaches a predetermined work position (i.e., a position of the board P shown in FIG. 2), and then the board P is temporarily stopped. At this work position, the components are mounted on the board P. When mounting work is over, the conveyors 12 further convey the board P toward the +X side to carry the board P out of the mounting machine 1.

The mobile frame 13 is a frame extending in the X direction and is supported by the base 11 so as to be movable in the Y direction. The head unit 14 is mounted on the mobile frame 13 such that the head unit 14 is allowed to move in the X direction. In other words, the head unit 14 can be moved in the Y direction along with movement of the mobile frame 13 in the Y direction, and can also move in the X direction along the mobile frame 13. The head unit 14 has a plurality of heads 14H that suck and hold a component to be mounted on the board P. The heads 14H suck and hold (take out) a component at a component takeout position HT (FIG. 3, FIG. 4), which will be described later, moves the component onto the board P, and places the component at a predetermined mounting position on the board P.

The Y-axis drive mechanisms 15 are paired mechanisms that are arranged respectively on a +X-side end and a −X-side end of the base 11 and that cause the mobile frame 13 to move in the Y direction. The Y-axis drive mechanisms 15 each include, for example, a ball screw shaft extending in the Y direction, a drive motor that causes the ball screw shaft to rotate, and a ball nut disposed on the mobile frame 13 and screwed on the ball screw shaft. The X-axis drive mechanism 16 is a mechanism that is disposed on the mobile frame 13 and that causes the head unit 14 to move in the X direction along the mobile frame 13. The X-axis drive mechanism 16 includes, for example, a ball screw shaft extending in the X direction, a drive motor, and a ball nut, similarly to the Y-axis drive mechanism 15.

The component supply units 20A to 20D (component supply devices) are attached with required component storage members, and supply components to be mounted on the board P. Across the conveyors 12, two component supply units 20A and 20B are disposed in a −Y-side area of the base 11 while two component supply units 20C and 20D are disposed in a +Y-side area of the base 11. FIG. 2 shows an example in which a plurality of tape feeders 2 arranged in the X direction are attached to each of the component supply units 20A to 20D.

Each tape feeder 2 supplies components E stored in the component storage tape 3 (component storage member shown in FIG. 4), to the predetermined component takeout position HT. As will be described in detail later, the tape feeder 2 is a tape feeder of autoloading type that can be loaded with both a preceding component storage tape and a subsequent component storage tape and that can feed out both tapes consecutively without performing splicing work of splicing the tapes together. To each of the component supply units 20A to 20D, a plurality of types of tape feeders 2 different in size, tape transfer path, and type can be attached. It should be noted that the tape feeder is not limited to the autoloading type, but may be a splicing type. In this case, waste materials include a carrier tape of a preceding component storage tape, the carrier tape with components removed therefrom, and a cover tape peeled off from the carrier tape.

It should be noted that a feeder to be attached to the component supply units 20A to 20D is not limited to the tape feeder 2. For example, a tray feeder having a tray that holds a plurality of components arranged on a plane or a stick feeder having a cylindrical stick that holds a plurality of components arranged in series may also be attached to the component supply units 20A to 20D.

[Details of Tape Feeder]

Figure 3:
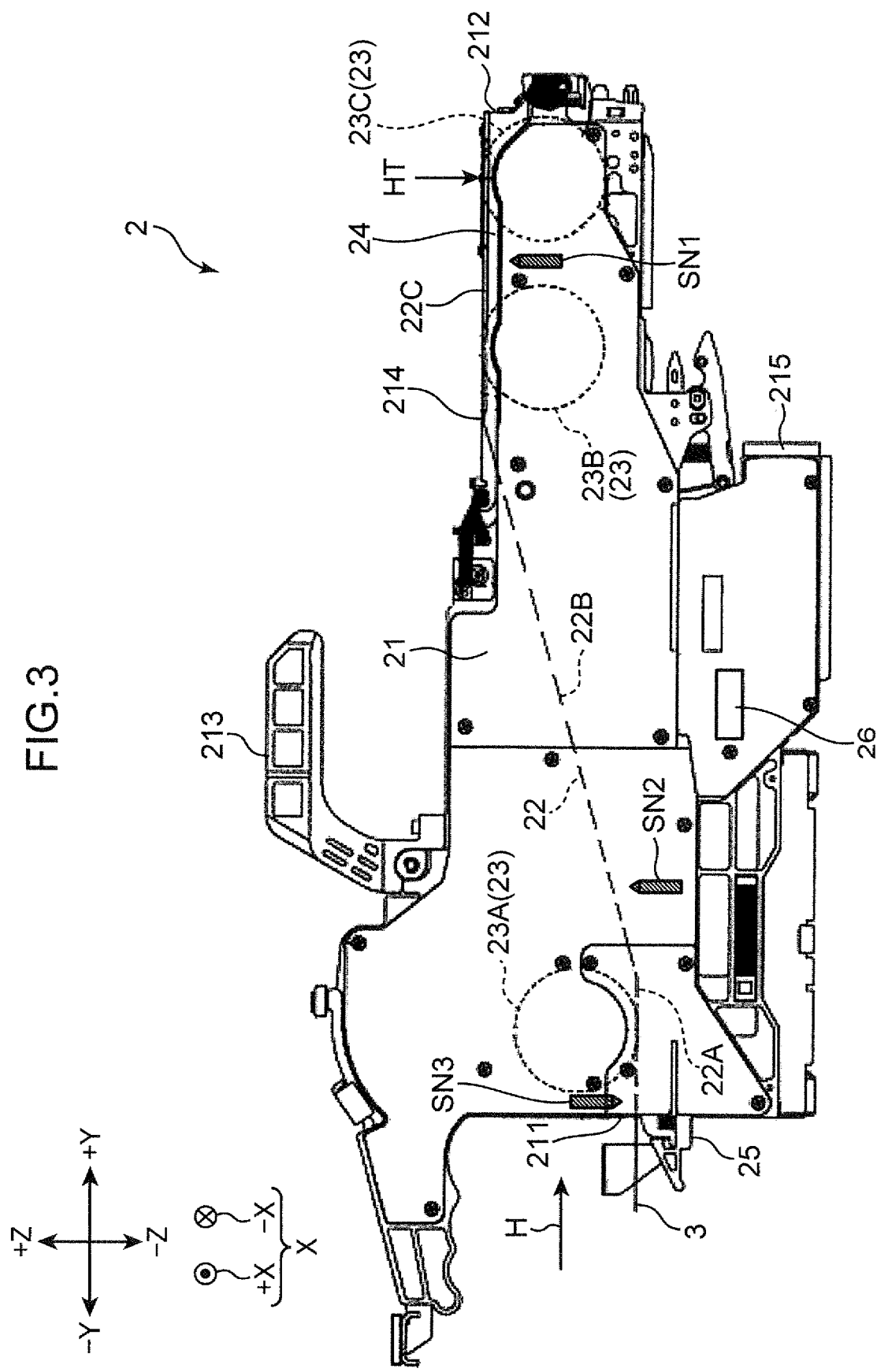
FIG. 3 is a side view of a tape feeder attached to the mounting machine.
Figure 4:
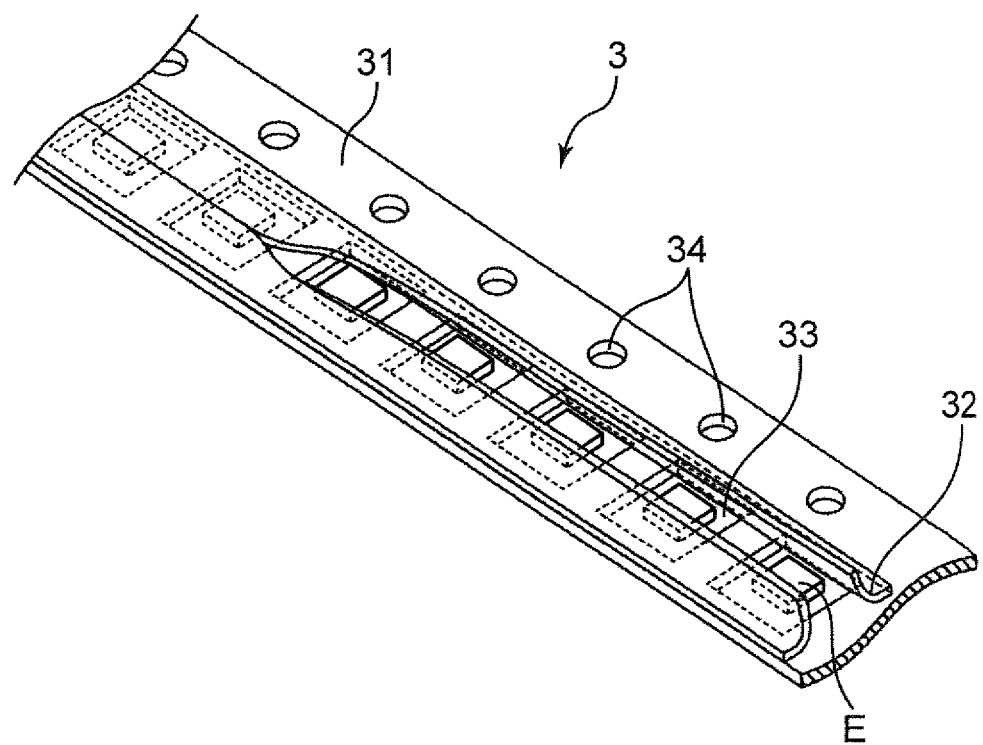
FIG. 4 is a perspective view of a component storage tape.

FIG. 3 is a side view of the tape feeder 2, and FIG. 4 is a perspective view of the component storage tape 3 fed out by the tape feeder 2. The tape feeder 2 has a housing 21 that is elongated in the Y direction in a side view and that has a width in the X direction, the width allowing the housing 21 to house the component storage tape 3. The housing 21 has an opening formed near a downstream end (+Y-side end portion) in a tape feed direction H of the housing 21, the opening serving as the component takeout position HT. The tape feeder 2 supplies a component E stored in the component storage tape 3, toward this component takeout position HT. The heads 14H of the head unit 14 suck and hold the component E at the component takeout position HT (see FIG. 5).

As shown in FIG. 4, the component storage tape 3 includes a carrier tape 31 and a cover tape 32. The carrier tape 31 is a tape having a plurality of component storage portions 33 arranged at predetermined intervals, the component storage portions 33 being recesses in which components E are stored. The carrier tape 31 has, on one end in the width direction, engaging holes 34 arranged at predetermined intervals, the engaging holes 34 engaging with respective teeth of first, second, and third sprockets 23A, 23B, and 23C, which will be described later, to receive a transfer force for feeding out the component storage tape 3, the transfer force being transmitted from the sprockets 23A, 23B, and 23C. The cover tape 32 is a tape pasted on the carrier tape 31 so as to cover the component storage portions 33. FIG. 4 shows a state in which the cover tape 32 is cut open by a center-cut method to expose components E. The components E are, for example, small pieces of chip components, such as transistors, resistors, and capacitors, integrated circuit (IC) components, or the like. It should be noted that a method of exposing the components E is not limited to the center-cut method, and may be, for example, a single-opening method by which the cover tape 32 is cut open in the vicinity of a joining portion where the cover tape 32 is joined to the carrier tape 31. Further, in the case of a tape feeder of splicing type, a method of peeling the cover tape 32 from the carrier tape 31 is adopted.

The housing 21 has a tape inlet 211 on a −Y-side end face where the component storage tape 3 is inserted in the tape inlet 211, and a tape outlet 212 on a +Y-side end face where the component storage tape 3, from which the components E have been taken out at the component takeout position HT, is ejected out of the tape outlet 212 as a waste tape. To an upper surface (+Z-side end face) of the housing 21, a grip 213 is attached, which is used by a user when the user carries the tape feeder 2.

Inside the housing 21, a tape transfer path 22 and a tape feed unit 23 are provided. The tape transfer path 22 is a transfer path for transferring the component storage tape 3 in a tape feed direction H (direction from the −Y side toward the +Y side) between the tape inlet 211 and the tape outlet 212. The tape feed unit 23 gives the component storage tape 3 a driving force that causes the component storage tape 3 to travel along the tape transfer path 22.

The tape transfer path 22 includes a first transfer path 22A, a second transfer path 22B, and a third transfer path 22C that are arranged consecutively in order in the tape feed direction H. The first transfer path 22A extends horizontally in the +Y direction from the tape inlet 211. The second transfer path 22B slopes upward and extends in the +Y direction, from a +Y-side end of the first transfer path 22A. The third transfer path 22C extends horizontally in the +Y direction, from a +Y-side end of the second transfer path 22B to the tape outlet 212. The third transfer path 22C is a transfer path extending along an upper surface 214 of the housing 21. The component takeout position HT is set near a downstream end of this third transfer path 22C. A tape guide 24 that guides traveling of the component storage tape 3 is attached to the third transfer path 22C.

The tape feed unit 23 includes the first sprocket 23A, the second sprocket 23B, the third sprocket 23C, and a motor (not shown) that applies a rotational driving force to these sprockets. These first to third sprockets 23A to 23C each have a disk-shaped rotating wheel, and a plurality of teeth arranged at a predetermined pitch (which is the same as a pitch of arrangement of the engaging holes 34 of the component storage tape 3) on the outer peripheral edge of the rotating wheel. The teeth are fitted into the engaging holes 34, and the rotating wheel rotates to feed out the component storage tape 3.

The first sprocket 23A is disposed near the tape inlet 211. The teeth of the first sprocket 23A face the first transfer path 22A, and the rotation of the first sprocket 23A feeds out the component storage tape 3 toward the downstream side of the tape transfer path 22. The third sprocket 23C is disposed near the tape outlet 212, and the second sprocket 23B is disposed upstream of the third sprocket 23C in the tape feed direction H. The second and third sprockets 23B and 23C are rotated synchronously, and their teeth face the third transfer path 22C. Along with rotation of the second and third sprockets 23B and 23C, the component storage tape 3 is pulled out from a reel and is sent out of the housing 21 through the tape outlet 212.

A tape attaching jig 25 slidable in the Y direction is attached to the vicinity of the tape inlet 211 of the housing 21. The tape attaching jig 25 is a jig that is used when a front end portion of the component storage tape 3 is engaged with the teeth of the first sprocket 23A to load the component storage tape 3 to the component takeout position HT. In addition, the tape attaching jig 25 has a function of disengaging the component storage tape 3 from the first sprocket 23A after the front end portion of the loaded component storage tape 3 engages with the teeth of the second and third sprockets 23B and 23C.

Inside the housing 21, a first sensor SN1, a second sensor SN2 and a third sensor SN3 are arranged. The first to third sensors SN1 to SN3 are sensors that detect the presence or absence of the component storage tape 3 or the presence or absence of components in the component storage tape 3. For example, as the first to third sensors SN1 to SN3, an optical sensor formed of a combination of a light source and a light quantity sensor that receives detection light from the light source, the light source and the light quantity sensor being arranged with the tape transfer path 22 interposed therebetween, can be used. Based on a difference in a quantity or distribution of light received by the light quantity sensor, the optical sensor can identify a case where the component storage tape 3 storing components is present on the tape transfer path 22, a case where the component storage tape 3 storing no component is present on the tape transfer path 22, and a case where the component storage tape 3 is not present on the tape transfer path 22. In this case, a mechanism that is displaced depending on the presence or absence of the component storage tape 3, for example, a displacement plate, such as a plate or a leaf spring, may be provided such that the light source and the light quantity sensor are arranged with the displacement plate interposed therebetween so that the presence or absence of the component storage tape 3 is determined by checking whether the displacement plate is present between the light source and the light quantity sensor. Further, the light quantity sensor may be replaced with a light-receiving element, in which case the presence or absence of the component storage tape 3 is determined by checking whether the light-receiving element detects light emitted from the light source.

In the housing 21, the first sensor SN1 is disposed slightly upstream of the component takeout position HT in the tape feed direction H such that the first sensor SN1 is opposed to the tape transfer path 22. The first sensor SN1 serves as a sensor for checking whether the component storage tape 3 storing the components E has been supplied to the component takeout position HT, that is, whether loading of the component storage tape 3 to the component takeout position HT has been completed, and serves also as a sensor that detects that the component storage tape 3 have run out of the components E.

The second sensor SN2 is a sensor disposed upstream of the first sensor SN1 in the tape feed direction H. The second sensor SN2 is disposed slightly downstream of the first sprocket 23A such that the second sensor SN2 is opposed to the tape transfer path 22. The second sensor SN2 is a sensor that detects a rear end in the tape feed direction H of the component storage tape 3. The third sensor SN3 is disposed near the location of the tape attaching jig 25, i.e., near the tape inlet 211. The third sensor SN3 is a sensor that detects whether a subsequent component storage tape 3 is attached at a predetermined position of the tape inlet 211.

A control board and the like for controlling the operation of the tape feeder 2 is housed in the vicinity of a lower part of the housing 21. A connector 215 is attached to the vicinity of the lower part of the housing 21. The connector 215 is supplied with power and various control signals from the mounting machine 1 through a cable (not shown). The housing 21 has a feeder recording portion 26 attached to its side surface on the X-side. The feeder recording portion 26 records thereon feeder information for identifying the tape feeder 2.

[Autoloading Mechanism]

Figure 5:
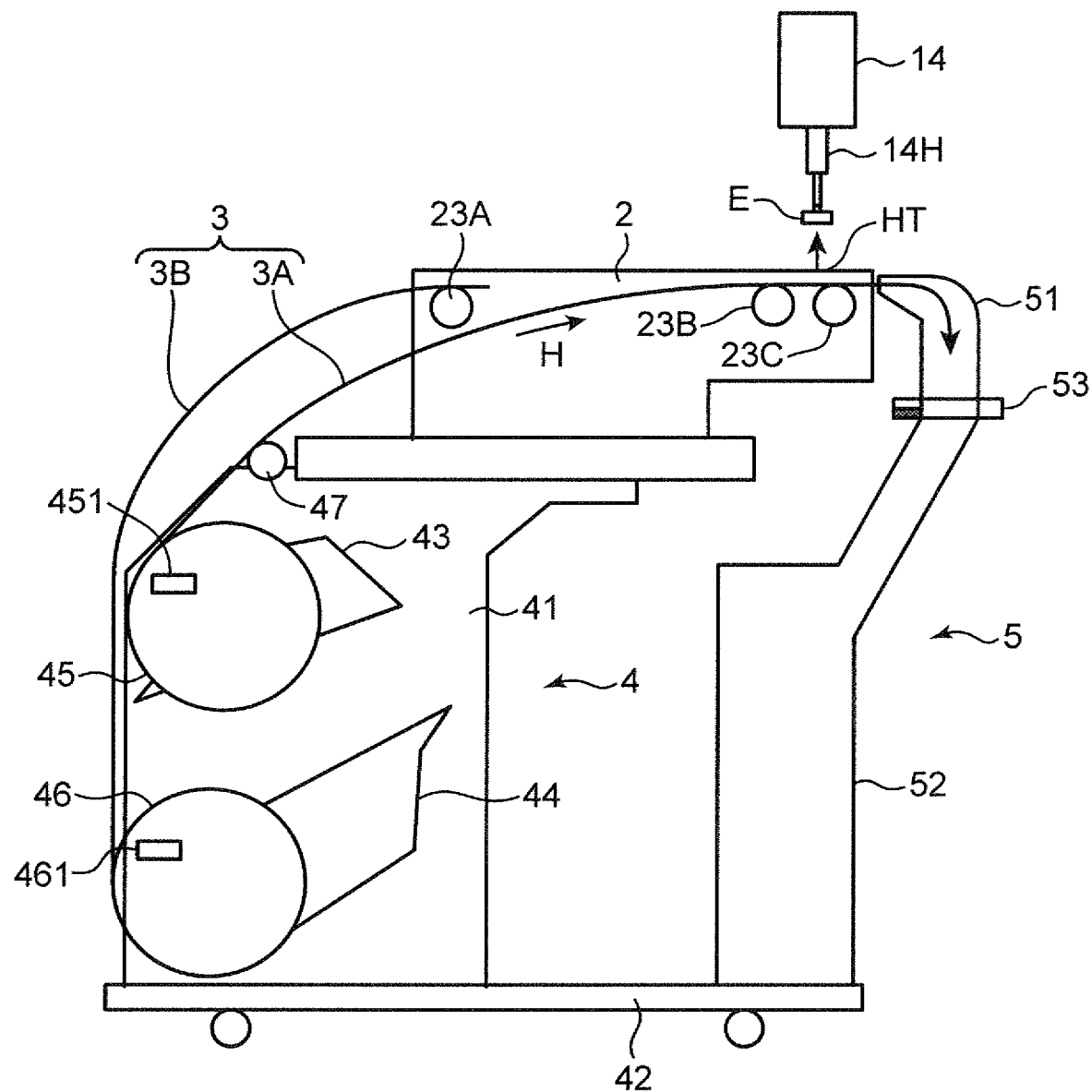
FIG. 5 is a side view schematically showing a configuration of a component supply device attached with the tape feeder.

FIG. 5 is a side view schematically showing a configuration of each of the component supply units 20A to 20D attached with the tape feeders 2. The tape feeder 2 can be attached with two component storage tapes 3. Specifically, a first component storage tape 3A that supplies the components E first and a second component storage tape 3B that supplies the components E after the supply of the components E by the first component storage tape 3A are attached to the tape feeder 2.

Generally, the tape feeder 2 first intermittently sends out the preceding first component storage tape 3A to supply the components E to the component takeout position HT. When the first component storage tape 3A runs out of the components, the tape feeder 2 is then automatically loaded with the subsequent second component storage tape 3B, and intermittently sends out the second component storage tape 3B to supply the components E to the component takeout position HT. Thereafter, this second component storage tape 3B serves as the "preceding first component storage tape 3A". Thus, a new second component storage tape 3B, which is to be automatically loaded onto the tape feeder 2, is attached to the tape attaching jig 25.

Each tape feeder 2 of the component supply units 20A to 20D is supported by a carriage 4. The carriage 4 includes a reel support 41 and a carriage base 42 with casters, the carriage base 42 supporting a lower surface of the reel support 41. The reel support 41 is provided with a first reel holder 43 on the upper side and with a second reel holder 44 on the lower side. The first reel holder 43 rotatably supports a first reel 45 being wound with the preceding first component storage tape 3A. The second reel holder 44 rotatably supports a second reel 46 being wound with the subsequent second component storage tape 3B.

The first reel 45 and the second reel 46 have a first recording portion 451 and a second recording portion 461 (management identifiers) attached respectively on the side surfaces of the first and second reels 45 and 46. The first and second recording portions 451 and 461 record thereon component identification information for identifying the components E stored in the component storage tapes 3A and 3B wound respectively around the first and second reels 45 and 46, component type information on component types, number-of-component information on the number of components per reel, reel identification information (reel ID), lot identification information for identifying a lot of reels, and the like. The first and second recording portions 451 and 461 are each provided as, for example, a bar code that is a code of read component information.

FIG. 5 shows a state in which the first component storage tape 3A sent out from the first reel 45 is being fed by the tape feeder 2. The first component storage tape 3A enters the tape feeder 2 while being guided by a guide roller 47 disposed on an upper end of the reel support 41, and engages with the second and third sprockets 23B and 23C. The rotation of the second and third sprockets 23B and 23C feeds out the first component storage tape 3A intermittently via the component takeout position HT. At the component takeout position HT, the heads 14H of the head unit 14 take out the component E. The second component storage tape 3B stands by in a state in which its front end is ready to engage with the first sprocket 23A.

From the state of FIG. 5, the first component storage tape 3A is further fed out, and when the first component storage tape 3A having run out of components is detected by the first sensor SN1 (FIG. 3), the autoloading operation is carried out. In general, the rear end of the component storage tape 3 has an extra length portion in which no component E is stored. When the first sensor SN1 detects that the first component storage tape 3A have run out of components, it means that a most upstream part of the extra length portion has reached the component takeout position HT. In this case, a tape ejection operation is carried out to send out the entire first component storage tape 3A including its termination. Through this operation, the extra length portion is scrapped.

Before the tape ejection operation is carried out, the worker engages a front end portion of the second component storage tape 3B with the first sprocket 23A, using the tape attaching jig 25. This is an example of "resupply work", which will be described later. After the tape ejection operation, the first sprocket 23A is rotated to feed out the second component storage tape 3B. The front end portion of the second component storage tape 3B then comes to engage with the second sprocket 23B. Subsequently, the rotation of the second sprocket 23B feeds out the second component storage tape 3B (as the first sprocket 23A keeps idling).

Thereafter, the worker operates the tape attaching jig 25 to release the second component storage tape 3B from its state of engagement with the first sprocket 23A. At this stage, the second component storage tape 3B comes to serve as the "preceding first component storage tape 3A". The worker mounts a reel wound with a new second component storage tape 3B on the reel support 41, and attaches a front end portion of this new second component storage tape 3B to the tape attaching jig 25 to get ready for the next autoloading.

[Waste Material Storage Unit]

The mounting machine 1 is provided with a storage unit for storing waste materials related to the component storage member. In the case of the tape feeder 2 illustrated above, the waste materials include a waste tape, i.e., the component storage tape 3A or 3B from which the components have been removed, and an empty reel, i.e., a reel around which the component storage tape 3A or 3B have been wound. In the case of the tray feeder, the waste material is an empty tray, i.e, a tray from which the components have been removed. In the case of the stick feeder, the waste material is an empty stick, i.e., a stick from which the components have been removed.

FIG. 5 shows a waste material storage unit for the tape feeder 2. Specifically, the carriage 4, which is attached detachably to the mounting machine 1, has a waste tape collecting unit 5 that collects the component storage tapes 3A and 3B (waste tapes) from which the components have been taken out. The waste tape collecting unit 5 is disposed on the carriage 4, and includes a duct 51, a collection box 52, and a cutter device 53. The duct 51 is a duct that is connected to the tape outlet 212 of the tape feeder 2 and that guides the first component storage tapes 3A and 3B, from which the components E have been taken out, which are ejected out of the tape outlet 212 to travel in a predetermined direction, that is, guides the component storage tapes 3A and 3B to the collection box 52 placed below the tape outlet 212. The collection box 52 is a box in which the waste tape is stored. The cutter device 53 has a cutter blade that performs a cutting operation of cutting the waste tape. This cutting operation prevents jamming of the waste tape in the duct 51 due to the waste tape having an excessively long unit length.

A storage unit for storing empty reels, i.e., the first and second reels 45 and 46 having fed out the entire component storage tapes 3A and 3B is provided as a first type of storage unit and a second type of storage unit. The first type refers to a case where empty reels are directly held by the first and second reel holders 43 and 44, and the second type refers to a case where empty reels are collected in a collection box with reel slots.

Figure 6A:
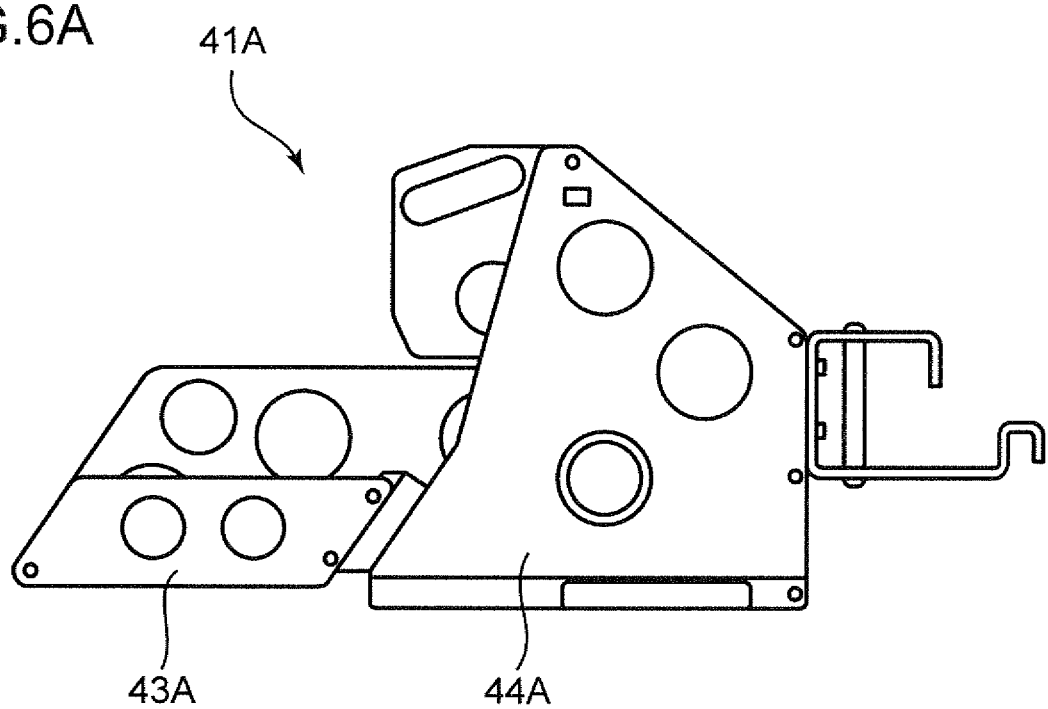
FIG. 6A is a side view showing an example of a reel holder that holds a reel wound with the component storage tape.
Figure 6B:
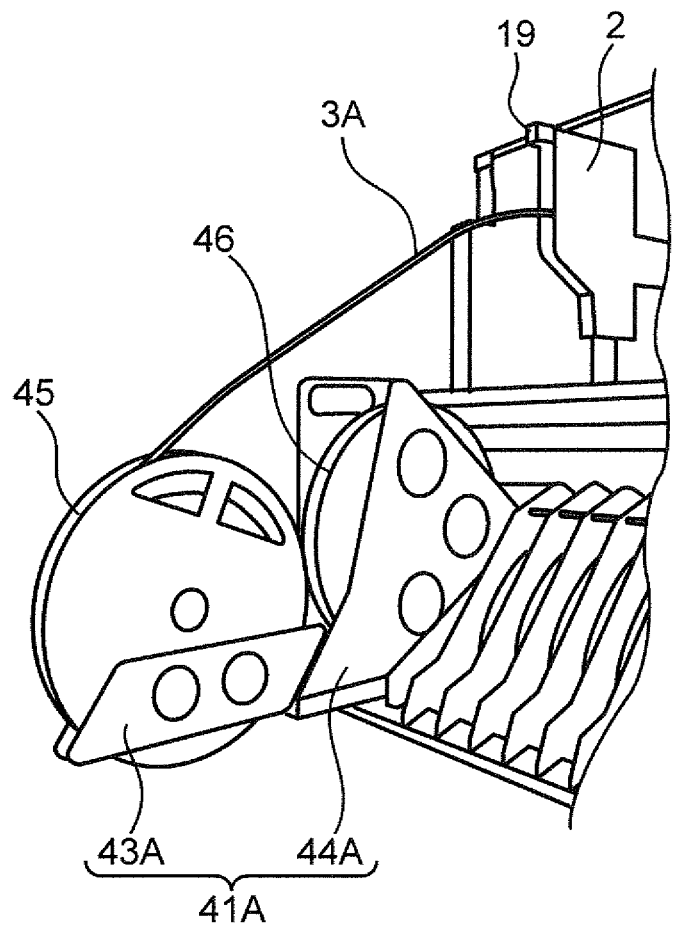
FIG. 6B is a perspective view showing a state of reels being stored in the reel holder.

FIG. 6A is a side view of an example of a reel holder 41A that works as the first type of storage unit, and FIG. 6B is a perspective view showing a state of the first and second reels 45 and 46 being stored in the reel holder 41A. The reel holder 41A has a first holder portion 43A and a second holder portion 44A that are arranged horizontally. The first and second holder portions 43A and 44A have slot-shaped storage spaces in which the first and second reels 45 and 46 are rollably held, respectively.

FIG. 6B shows a state in which the first reel 45 stored in the first holder portion 43A sends out the first component storage tape 3A, thus supplying it to the tape feeder 2, while the empty second reel 46, i.e., the second reel 46 having sent out the entire second component storage tape 3B is stored in the second holder portion 44A. In other words, the empty reel (second reel 46), which is left as a waste material after completion of component supply, is held directly in the second holder portion 44A. In collection work, the worker takes this empty reel out of the second holder portion 44A, and attaches a new reel wound with the component storage tape 3 to the second holder portion 44A. As will be described later, referring to FIG. 18, empty reel collection work is executed after collection permission is given. The tape feeder 2 is provided with a collection instruction lamp 19 (display means) that indicates the tape feeder 2 being a tape feeder to be subjected to the empty reel collection work. With the collection instruction lamp 19 being turned on, the worker recognizes the position of the tape feeder 2 to be subjected to the collection work, thus executing the empty reel collection work.

Figure 7A:
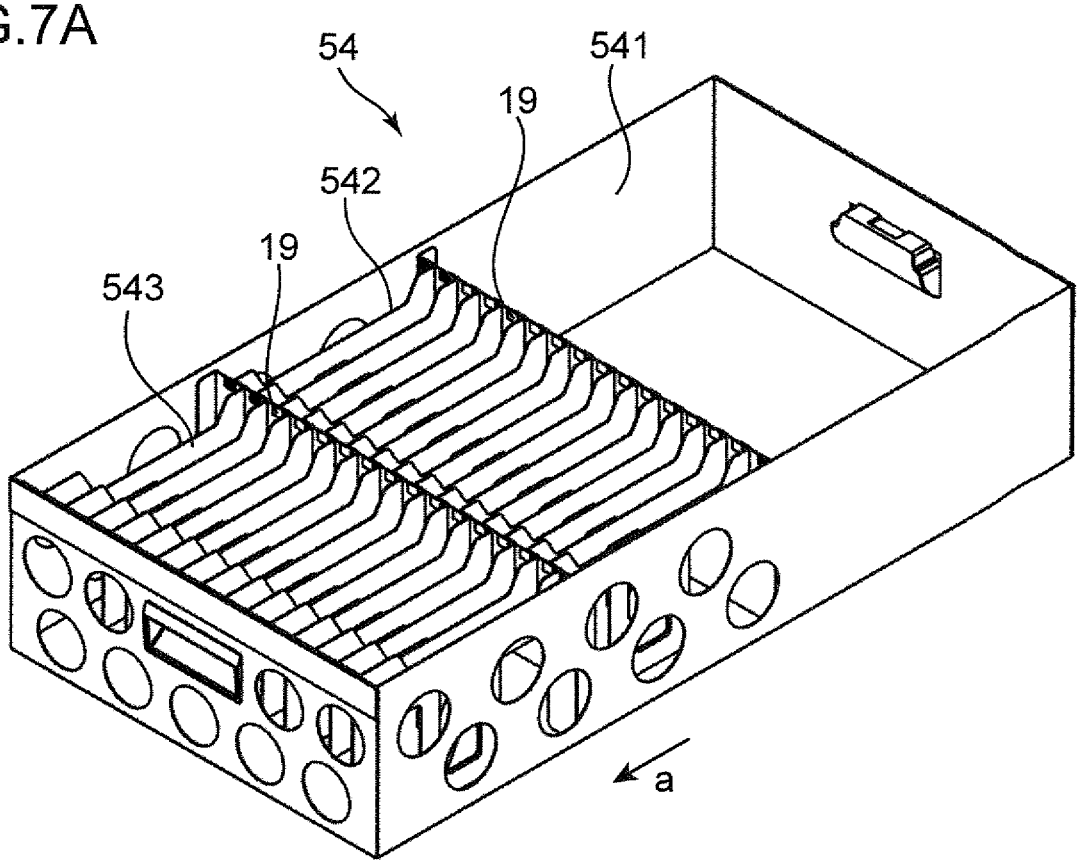
FIG. 7A is a perspective view showing an example of a collection box with reel slots.
Figure 7B:
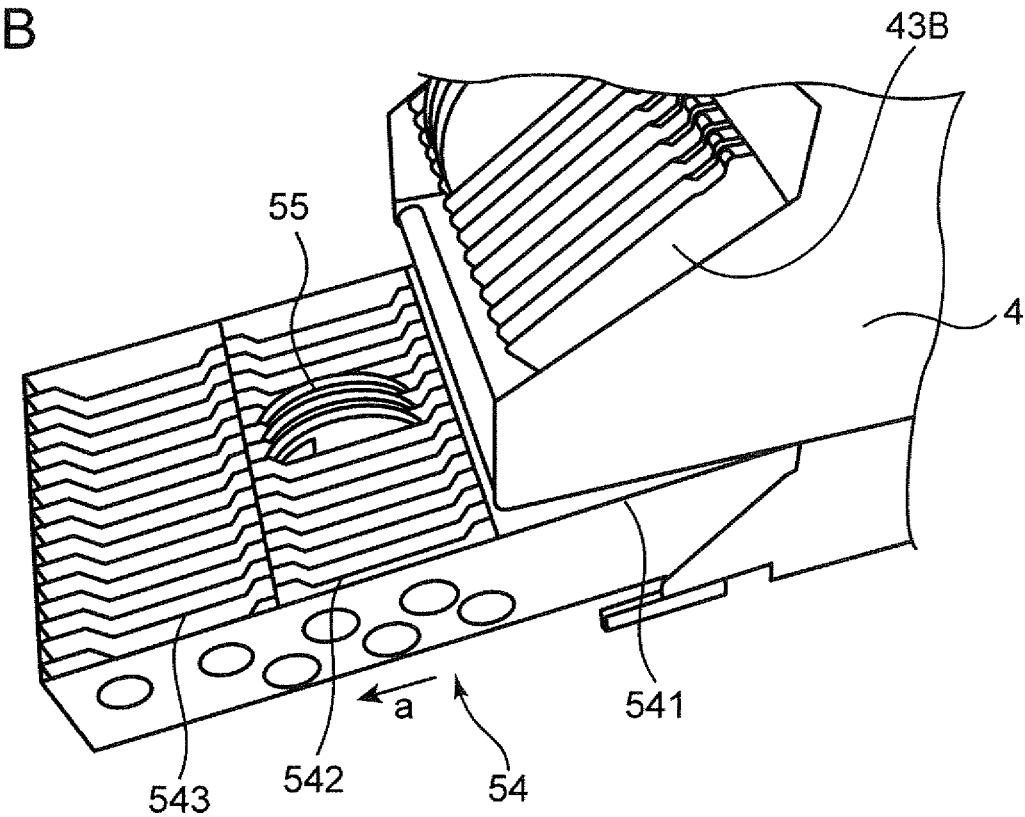
FIG. 7B is a perspective view showing a state of reels being stored in the collection box.

FIG. 7A is a perspective view of an example of a collection box 54 with reel slots, which is used as the second type of storage unit for storing empty reels, and FIG. 7B is a perspective view showing a state of reels being stored in the collection box 54. The collection box 54 is a box with a top opening that is attached to a lower part of the carriage 4 shown in FIG. 4 such that the box can be pulled out in a pullout direction a. The collection box 54 has a waste tape storage unit 541, first collection slots 542, and second collection slots 543.

In the example of FIG. 5, for example, the waste tape storage unit 541 is disposed so as to face a lower opening of the duct 51, and stores a waste tape being dropped through the duct 51. The first collection slots 542 and the second collection slots 543 are slots each having a width in the front-to-rear direction and left-to-right direction that allow each slot to accommodate each empty reel. These collection slots 542 and 543 are disposed below the two reel holders 43B arranged in the pullout direction a. FIG. 7B shows only one of the reel holders 43B and shows also a state of the collection box 54 being pulled out of the carriage 4 in the pullout direction a. The reel holder 43B has a holding portion that holds a part of reel that is wound with the component storage tape 3, from the outer periphery side of the part. When the component storage tape 3 is kept sent out to eventually leave the reel without the part wound with the tape 3, the reel is not held by the reel holder 43B anymore and, consequently, drops into one of the collection slots 542 and 543.

FIG. 7B shows a state of the empty reels 55 being stored in the first collection slots 542. In collection work, the worker pulls out the collection box 54 in the pullout direction a, and collects the empty reels 55 stored in the first collection slots 542 or second collection slots 543. Each of the first and second collection slots 542 and 543 is provided with the collection instruction lamp 19 described above. The worker thus collects the empty reel 55 from any one of the collection slots 542 and 543 that has its collection instruction lamp 19 switched on, that is, any one of the collection slots 542 and 543 that is given collection permission.

[Overall View of Resupply Work and Collection Work]

With reference to FIG. 1, description will then be made of an overall flow of resupply work of resupplying the component storage member to the mounting machine 1 of the production line S2 in the component mounting system S0 and an overall flow of collection work of collecting waste materials related to the component storage member. Board data D1 is stored in the data server 71, and production plan information D2 is stored in the production plan server 72. The work management system 51 carries out a predetermined process, referring to the board data D1 and the production plan information D2. The board data D1 is a file that defines, for each board type, information on components mounted on the board. Specifically, for a certain board type, the names and types of mounted components, the number of the components used, locations where the components are mounted, and the like are defined as the board data D1. The production plan information D2 is a file that describes which type of board is to be produced on which production line S2 and how many boards are to be produced.

Each mounting machine 1 includes a mounting machine control unit 10 that controls various operations of the mounting machine 1. Each mounting machine control unit 10 manages mounting information D3 on mounting of components. The mounting information D3 is a file that gives a description of how many component storage members carrying remaining components are attached to each of set positions of the component supply units 20A to 20D, together with a description of the number of the remaining components. For example, the file of mounting information D3 manages information indicating in which slot of the component supply unit 20A to 20D the tape feeder 2, which supplies the component storage tape 3 carrying components of a certain type, are attached, together with information of the number of remaining components. In addition, the mounting information D3 also manages set values, such as a warning number of remaining components, which is information that notifies the user of the number of remaining components being smaller than a predetermined number of components, and a supply-suspending number of components, which represents a number of remaining components even smaller than the warning number of components and therefore serves as a threshold for suspending component supply. The mounting information D3 is updated in succession according to the progress of board production. For example, at completion of each event, such as the mounting machine 1 having finished with a predetermined process on one board and ejecting it out, updated mounting information D3 is transmitted to the work management system 51. The board data D1 may be kept by the mounting machine control unit 10.

The work management system 51 is a system that at least manages resupply work of resupplying the reel (first or second reel 45 or 46 shown in FIG. 5) wound with the component storage tape 3, to each of the tape feeders 2 attached to the component supply units 20A to 20D of each mounting machine 1. To reduce resupply work load on the worker, the work management system 51 creates work data that allows "collective resupply" of collectively carrying out resupply work of resupplying the reels to the tape feeders 2 that can be resupplied with the reels at the same resupply timing. Needless to say, target feeders to be subjected to "collective resupply" include feeders other than the tape feeder 2. For example, the tray feeder and stick feeder, which have been mentioned above, are also included in the target feeders to be subjected to "collective resupply". Further, according to the present embodiment, the work management system 51 creates work data that upon execution of "collective resupply", also allows execution of collection work of collecting waste materials related to the component storage member (a waste tape, an empty reel, an empty tray, an empty stick, and the like of the component storage tape 3).

The work management system 51 includes a processing unit 6 that carries out various processes. The processing unit 6 will be described in detail later, referring to FIG. 8. Based on a component consumption estimate determined from the board data D1 and the production plan information D2 and on the current number of remaining components obtained from the mounting information D3, the processing unit 6 successively carries out calculations for predicting the tape feeder 2 and other feeders' running out of components, thereby creating prediction result data D4. For example, the prediction result data D4 on the autoloading type tape feeder 2 includes a time at which a reel to be used next can be set (resupplied) in advance, a time at which the above warning number of components or supply-suspending number of components is issued, and a time at which production is suspended because of remaining components being zero. The prediction result data D4 includes also data on a state of generation of waste tapes and empty reels.

In the work management system 51, pieces of prediction result data D4 created for the component supply units 20A to 20D (tape feeders 2) of all mounting machines 1 subjected to work management are managed as master data D5. The master data D5 is updated successively according to the progress of production of component mounting boards on the production line S2. In other words, the processing unit 6 carries out calculations for determining the latest prediction result data D4 at predetermined intervals (e.g., 30 seconds), and this latest data is incorporated successively into the master data D5.

When a request for "collective resupply" work is made to the work management system 51, work data D6 for "collective resupply" is cut out from the latest master data D5 at the point of reception of the request. The work data D6 is a list of a plurality of tape feeders 2 (mounting machine 1) that can be resupplied with parts at the same resupply timing, the tape feeders 2 being retrieved from the master data D5, and of resupply works and waste material collection works to be executed by the worker, the resupply works and waste material collection works being arranged in the order to be executed. The work data D6 is created with reference to a predetermined route, through which the worker makes a patrol of the mounting machines 1 during resupply work, to a predetermined standard work time, and the like.

The work data D6 is delivered from the work management system 51 to the terminal device 73 carried by each worker. The terminal device 73 is, for example, a tablet terminal device having a display unit that displays a work list for "collective resupply" and that allows entry of work completion information or the like. The worker, who carries the terminal device 73 displaying the work list, moves a carriage 75 capable of carrying reels R wound with component storage tapes 3, and stops by at a parts tower 76. The parts tower 76 is a place where reels R for various components are stored and a robot (not shown) loads the reels R, which are resupply parts listed on the work list, onto the carriage 75. The carriage 75 also has a waste material collection space.

The carriage 75 can be automatically transferred by the AGV 74, which is an unmanned vehicle. In this case, AGV instruction data that is created based on the work data D6 is delivered to the AGV 74. The AGV instruction data is a file that specifies the position of the mounting machine 1 at which the AGV 74 should stop, a time the AGV 74 remains stopped, a patrol route, and the like.

After loading the resupply parts onto the carriage 75 at the parts tower 76, the worker who operates the carriage 75 moves along the route for making a patrol of resupply, and stops by at the mounting machine 1 (component supply units 20A to 20D) specified in the work data D6. At this mounting machine 1, the worker carries out unit resupply works included in "collective resupply" in order. At this time, when an empty reel, which is a waste material that can be collected, or a waste tape, which is a waste material that needs to be collected, is present in the mounting machine 1 at which the worker stops by, the worker also carries out collection work of the waste material. Upon completing the resupply work and collection work at the mounting machine 1, the worker inputs work completion information on the mounting machine 1, to the terminal device 73. As a result, the work data D6 is updated, and the updated work data D6 is shared by another terminal device 73 connected to the work management system 51. Further, when attachment of the reel R to the mounting machine 1 is over, the mounting machine control unit 10 updates its mounting information D3. The updated mounting information D3 is sent to the work management system 51, where the updated mounting information D3 is reflected in the prediction result data D4 and the master data D5.

[Configuration of Work Management System]

Figure 8:
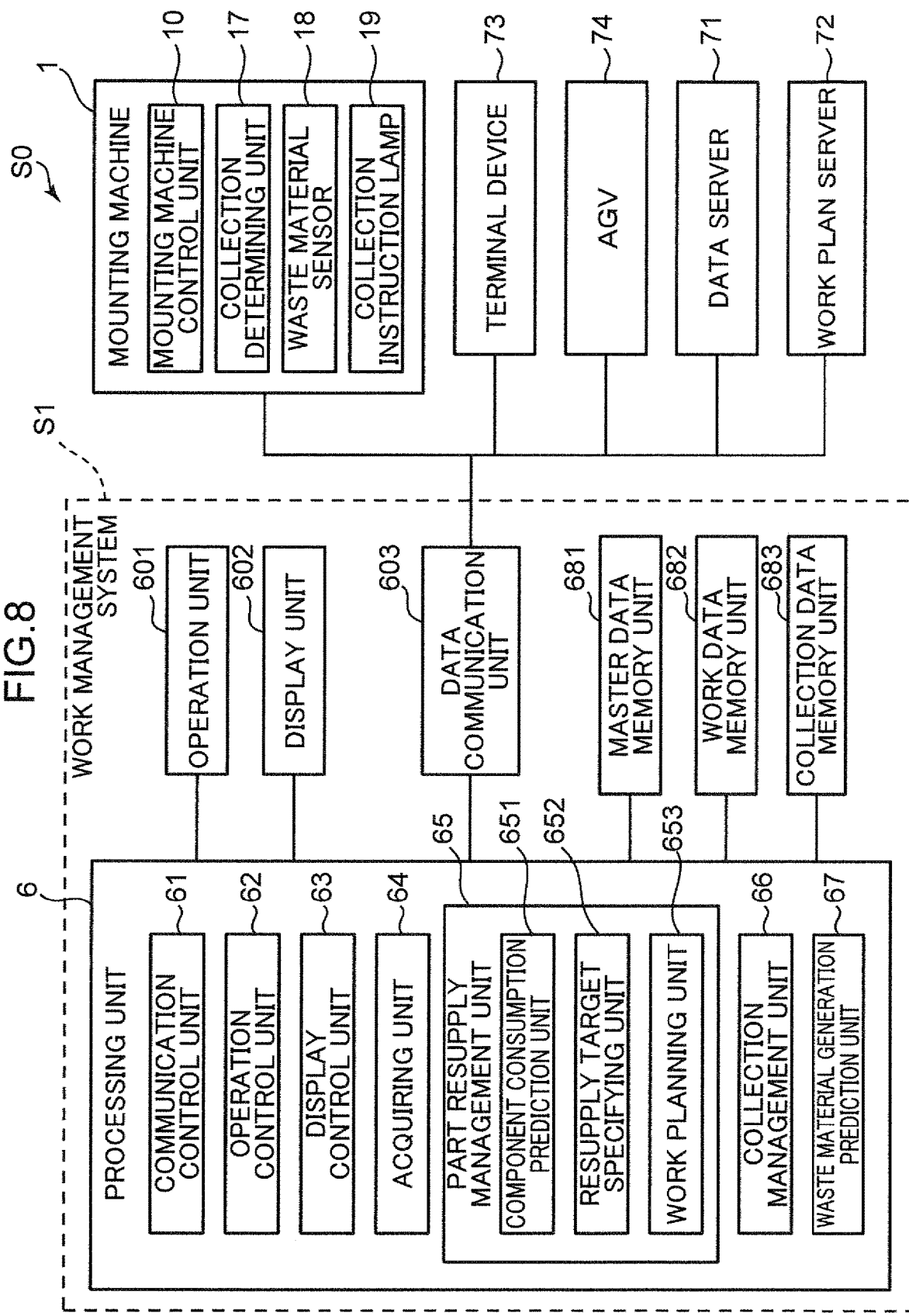
FIG. 8 is a block diagram of a configuration of a work management system.

FIG. 8 is a block diagram of a configuration of the work management system 51. The work management system 51 is provided as, for example, a personal computer, and incudes the processing unit 6, and an operation unit 601, a display unit 602, a data communication unit 603, a master data memory unit 681, a work data memory unit 682, and a collection data memory unit 683, which are connected to the processing unit 6.

The operation unit 601 has a keyboard, a touch panel, a start key, a setting key, and the like, and receives input of the worker's operations and various settings on the work management system 51. The display unit 602 is a display that displays various pieces of information on the work management system 51. The data communication unit 603 is an interface circuit for achieving data communication with the mounting machine 1, the data server 71, the production plan server 72, the terminal device 73, and the AGV 74.

The processing unit 6 includes a CPU, a ROM that stores a control program, and a RAM used as a work area for the CPU. As a result of execution of the control program, the processing unit 6 operates to include a communication control unit 61, an operation control unit 62, a display control unit 63, an acquiring unit 64, a part resupply management unit 65, a collection management unit 66, and a waste material generation prediction unit 67, as functional units.

The communication control unit 61 controls data communication between the data communication unit 603 and the mounting machine 1, the data server 71, the production plan server 72, the terminal device 73, and the AGV 74. Specifically, the communication control unit 61 receives, for each event, the mounting information D3 from the mounting machine 1, and timely reads the board data D1 from the data server 71 and the production plan information D2 from the production plan server 72 when necessary. As described above, the board data D1 is a file that describes, for each board type, the names and types of mounted components, the number of the components used, locations where the components are mounted, and order of mounting of the components.

FIG. 9 is a table format diagram showing an example of the production plan information D2 stored in the production plan server 72. The production plan information D2 is information including production order information J11, board type information J12, production lot information J13, production amount information J14, and part use information J15, which are associated with each other. The production order information J11 is information indicating the production order of a component mounting board. The board type information J12 is information indicating the type of a board to be produced. The production lot information J13 is information for specifying a production lot for each board type. The production amount information J14 is information indicating the number of component mounting boards produced per production lot. The part use information J15 is information on parts that are used for production of a component mounting board.

The part use information J15 is information including part identification information J151 for identifying a part, part type specifying information J152 for specifying a part type, number-of-required-parts information J153, and cycle time information J154, which are associated with each other. The number-of-required-parts information J153 indicates the number of parts required for production of one component mounting board ("board A" in this case). This information J153 is set for each part identified by the part identification information J151. The cycle time information J154 indicates a time that is required for mounting components on one board A at production thereof. This information J154 is set for each board type specified by the board type information J12.

FIG. 10 is a table format diagram showing an example of the mounting information D3 that is input to the work management system 51. The mounting information D3 includes mounting machine information J20, component supply device information J21, part identification (part ID) information J151, number-of-remaining-components information J22, and warning number-of-remaining-components information J23, which are associated with each other. The mounting machine information J20 is an ID number for identifying the mounting machine 1. The component supply device information J21 is information on the component supply units 20A to 20D used for production of a component mounting board. The component supply device information J21 includes device type information J211 indicating the types of the component supply units 20A to 20D (types of component supply methods), and device identification information (device ID) J212 for identifying each of feeder devices (tape feeders 2 (AF), tray feeders, or stick feeders) attached to the component supply units 20A to 20D.

The number-of-remaining-components information J22 is information on the number of remaining components in each feeder device, and is updated successively as components are consumed. The warning number-of-remaining-components information J23 is a set value (warning number of remaining components) for issuing a warning against the number of remaining components being close to zero in each feeder device. When the number of remaining components indicated by the number-of-remaining-components information J22 reaches the set value indicated by the warning number-of-remaining-components information J23, the mounting machine 1 issues a warning against the number of remaining components being close to zero. Although not shown in FIG. 10, the mounting information D3 may include a set number of remaining components that serves as a threshold for causing each feeder device to stop supplying components (remaining-component-based component supply suspension information).

Referring back to FIG. 8, the operation control unit 62 controls the operation unit 601. The display control unit 63 controls a display operation for information performed by the display unit 602.

The acquiring unit 64 acquires a management start time TS (FIG. 11) indicating a time to start management of resupply work of resupplying parts to each of the feeder devices attached to each of the mounting machines 1 constituting the production line S2. The acquiring unit 64 may acquire a time to start producing component mounting boards, as the management start time TS. Alternatively, when instruction information giving an instruction to start the management is input via the operation unit 601, the acquiring unit 64 may acquire a time at which the instruction information is input, as the management start time TS.

The part resupply management unit 65 manages a plan for resupply work of resupplying parts to each of the feeder devices of each mounting machine 1. This parts resupply work includes a resupply work of resupplying a new reel to each of the tape feeders 2, a resupply work of resupplying a new pallet to each of the tray feeders, and a resupply work of resupplying a new stick to each of the stick feeders. The part resupply management unit 65 creates the work data D6 for "collective resupply" in which, among the above resupply works, resupply works that can be executed at the same resupply timing are executed collectively.

Figure 11:
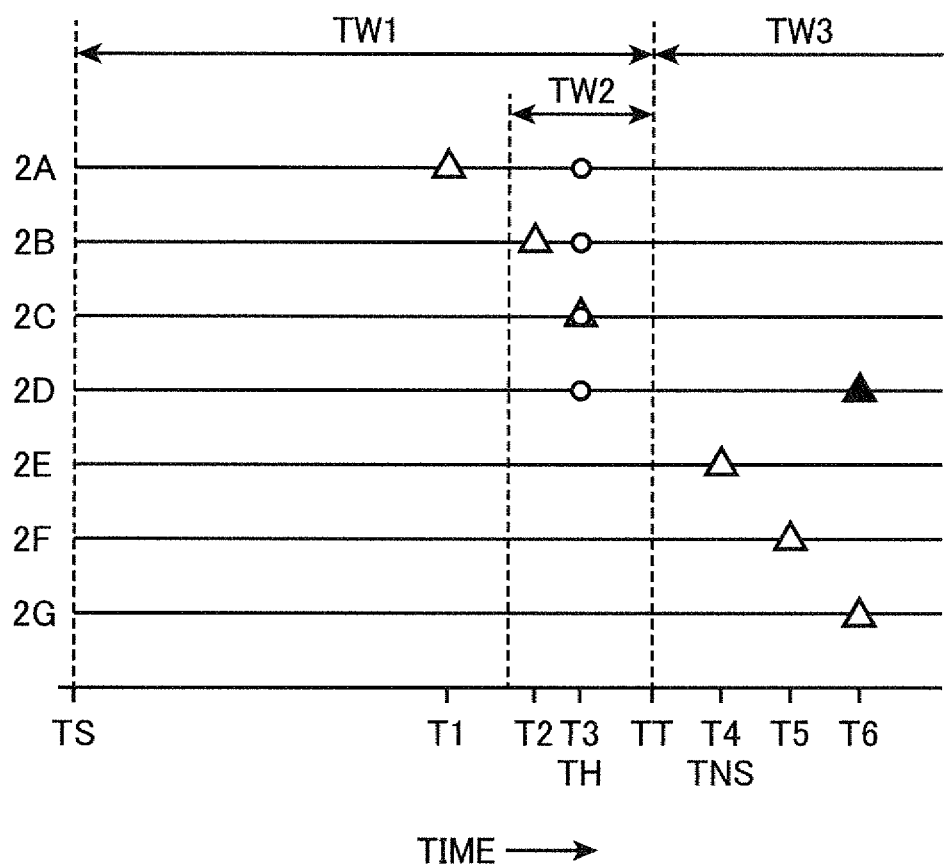
FIG. 11 is a diagram for describing a control operation of the work management system.

FIG. 11 is a diagram for describing the concept of "collective supply". For simpler description, "collective resupply" performed on seven autoloading type tape feeders 2A to 2G will be described. A time TS shown in FIG. 11 is a time at which a request for "collective supply" is made, and is equivalent to the management start time TS acquired by the above acquiring unit 64. Based on information input from the operation unit 601, the part resupply management unit 65 sets a specific period TW1 between the management start time TS and a specific time TT, which is a point of time of elapse of a specific time from the management start time TS. Further, the part resupply management unit 65 also sets, in the specific period TW1, a predetermined management period TW2 in which the specific time TT marks the latest time (hereinafter referred to as "latest time").

The part resupply management unit 65 includes a component consumption prediction unit 651, a resupply target specifying unit 652, and a work planning unit 653, as functional units. The component consumption prediction unit 651 is a functional unit that derives the prediction result data D4 shown in FIG. 1, carrying out a calculation for predicting a state of consumption of components E in each of the tape feeders 2A to 2G. When carrying out the calculation for predicting the consumption state, the component consumption prediction unit 651 refers to the board data D1, the production plan information D2, and the mounting information D3.

The resupply target specifying unit 652 monitors information of component supply by each of the tape feeders 2A to 2G, based on the prediction result data D4, and specifies a resupply time zone in which resupply work can be executed and a target mounting machine 1 to be subjected to the resupply work. Specifically, based on the above prediction result data D4, the resupply target specifying unit 652 specifies a resupply executable time at which a new reel can be resupplied to each of the tape feeders 2A to 2G. The resupply executable time is the time at which, at each of the tape feeders 2A to 2G, out of the first and second reels 45 and 46 respectively attached to the first and second reel holders 43 and 44, the reel wound with the preceding component storage tape 3A or 3B that supplies components first, runs out of the components to supply. When the preceding reel runs out of the components, the preceding reel can be replaced with a new reel as a resupply action. This resupply executable time is indicated by a mark "Δ" on each of time charts of the tape feeders 2A to 2G in FIG. 11. Further, the resupply target specifying unit 652 specifies a time to issue a warning on the number of remaining components, for each of the tape feeders 2A to 2G. The time to issue a warning on the number of remaining components is indicated by a mark "▲" in FIG. 11.

The resupply executable time is determined, for example, by the following procedures. It is assumed in this case that the first component storage tape 3A of FIG. 5 is a preceding tape and the second component storage tape 3B of FIG. 5 is a subsequent tape. First, the resupply target specifying unit 652 subtracts the number of remaining components on the second reel 46 wound with the subsequent second component storage tape 3B from the number of remaining components indicated by the number-of-remaining-components information J22 of the mounting information D3 (FIG. 10), to obtain the number of remaining components on the first reel 45 wound with the preceding first component storage tape 3A. In order to make the above subtraction unnecessary, the number of remaining components on the first reel 45 and the number of remaining components on the second reel 46 may be stored in the number-of-remaining-components information J22 as separate pieces of information. The resupply target specifying unit 652 then divides the number of components required for production of one component mounting board, the number of components being indicated by the number-of-required-components information J153 of the production plan information D2, by a time required for mounting the components on one component mounting board, the time being indicated by the cycle time information J154, to obtain the number of components used per second. Subsequently, the resupply target specifying unit 652 divides the number of remaining components on the preceding first reel 45 by the number of components used per second, to obtain the resupply executable time. The above time to issue a warning on the number of remaining components can be obtained by dividing, by the number of components used per second, a value obtained by subtracting the warning number of remaining components indicated by the warning number-of-remaining-components information J23 from the number of remaining components indicated by the number-of-remaining-components information J22.

In the example of FIG. 11, the resupply executable time T1 is specified for the tape feeder 2A. The resupply executable time T1 is earlier than the specific time TT and is also earlier than the earliest time in the management period TW2 (hereinafter referred to as "earliest time"), and is included in the specific period TW1. A time to issue a warning on the number of remaining components for the tape feeder 2A is not indicated in FIG. 11, and is included in a time zone TW3 later than the specific time TT.

For the tape feeders 2B and 2C, resupply executable times T2 and T3 are specified, respectively. The resupply executable times T2 and T3 are both earlier than the specific time TT but are later than the earliest time in the management period TW2, and are included in the management period TW2. A time to issue a warning on the number of remaining components for the tape feeder 2B and the same for the tape feeder 2C are not indicated in FIG. 11, and are included in the time zone TW3 set later than the specific time TT.

A resupply executable time for the tape feeder 2D is not indicated in FIG. 11. The resupply executable time for the tape feeder 2D is earlier than the specific time TT and is also earlier than the management start time TS. In other words, the resupply executable time for the tape feeder 2D has already arrived before a request for "collective resupply" is made. For the tape feeder 2D, however, a time T6 to issue a warning on the number of remaining components is specified. This time T6 to issue a warning on the number of remaining components is included in the time zone TW3 set later than the specific time TT.

For the tape feeders 2E, 2F, and 2G, resupply executable times T4, T5, and T6 are specified, respectively. The resupply executable times T4, T5, and T6 are all included in the time zone TW3 set later than the specific time TT. Respective times to issue a warning on the number of remaining components for the tape feeders 2E, 2F, and 2G are not indicated in FIG. 11. These times are later than the resupply executable times T4, T5, and T6, respectively, and are included in the time zone TW3 set later than the specific time TT.

The work planning unit 653 extracts a plurality of target mounting machines 1 with their resupply time zones overlapping each other, and creates a work plan to make a patrol of these target mounting machines 1 and execute the resupply work at the mounting machines 1. The work planning unit 653 is a functional unit that carries out a process of cutting out the work data D6 from the master data D5 shown in FIG. 1. Specifically, among the tape feeders 2A to 2G, the work planning unit 653 specifies a tape feeder with its resupply executable time (resupply time zone) being earlier than the specific time TT, as a component resupply target that is to be resupplied with a new reel in the management period TW2 within the specific period TW1. In the example shown in FIG. 11, the work planning unit 653 specifies all the tape feeders 2A to 2D with their resupply executable times being earlier than the specific time TT, as component resupply targets, and creates the work data D6 according to which the worker makes a patrol of the mounting machines 1 attached with these tape feeders 2A to 2D and executes resupply work at the mounting machines 1.

When creating the work data D6, the work planning unit 653 specifies resupply timing TH at which resupply work of resupplying the resupply target tape feeders 2A to 2D respectively with new reels can be carried out at the same timing in the management period TW2. In the example of FIG. 11, among the tape feeders 2A to 2D, the tape feeder with the latest resupply executable time is the tape feeder 2C, for which the resupply executable time T3 is set. This means that upon arrival of the time T3, resupply work can be executed at all the tape feeders 2A to 2D. The work planning unit 653 thus specifies any given time between the resupply executable time T3 and the specific time TT, as the resupply timing TH. A mark "o" in FIG. 11 represents the resupply timing TH, which is specified as the time T3 in the example of FIG. 11.

In this manner, according to the work management system 51 of the present embodiment, the work planning unit 653 specifies, as resupply work targets, all the tape feeders 2A to 2D that can be resupplied respectively with new reels in the management period TW2 with the specific time TT as a reference. As a result, "collective resupply", in which the worker collectively carries out a plurality of reel resupply works, can be executed at the tape feeders 2A to 2D that can be resupplied respectively with new reels in the management period TW2. Thus, based on the time TS at which the worker has made a request for "collective resupply", the worker takes the resupply timing TH to be a standard time to start resupply work, and carries out "collective resupply" of collectively resupplying new reels. Hence the frequency of the worker's moving to the mounting machine 1, which constitutes the production line S2, for resupply work can be reduced, and therefore work load is reduced.

The collection management unit 66 collects waste material data on a state of generation of waste materials in each of the plurality of mounting machines 1 constituting the production line S2, and manages collection work of collecting the waste materials, which is to be executed in future, for each mounting machine 1. The waste material data is, for example, data indicating the amount (weight, number, volume) of the above-mentioned waste tapes, empty reels, empty trays, empty sticks, and the like that are generated in each mounting machine 1. Further, as the above waste material collection management, for example, the collection management unit 66 carries out a process of specifying a collection time zone in which the collection work must be done, for each mounting machine 1, based on the waste material data.

The waste material generation prediction unit 67 carries out a process of predicting an amount of the waste materials generated, based on a state of component supply by each of the component supply units 20A to 20D of each mounting machine 1 or on a production plan of producing component mounting boards. To carry out this prediction process, the waste material generation prediction unit 67 refers to the production plan information D2 and the mounting information D3. This is because the amount of waste materials generated tends to increase with an increase in the amount of components used, that is, the number of boards produced and the amount of waste materials generated can be predicted by referring to the information D2 and D3.

Figure 12:
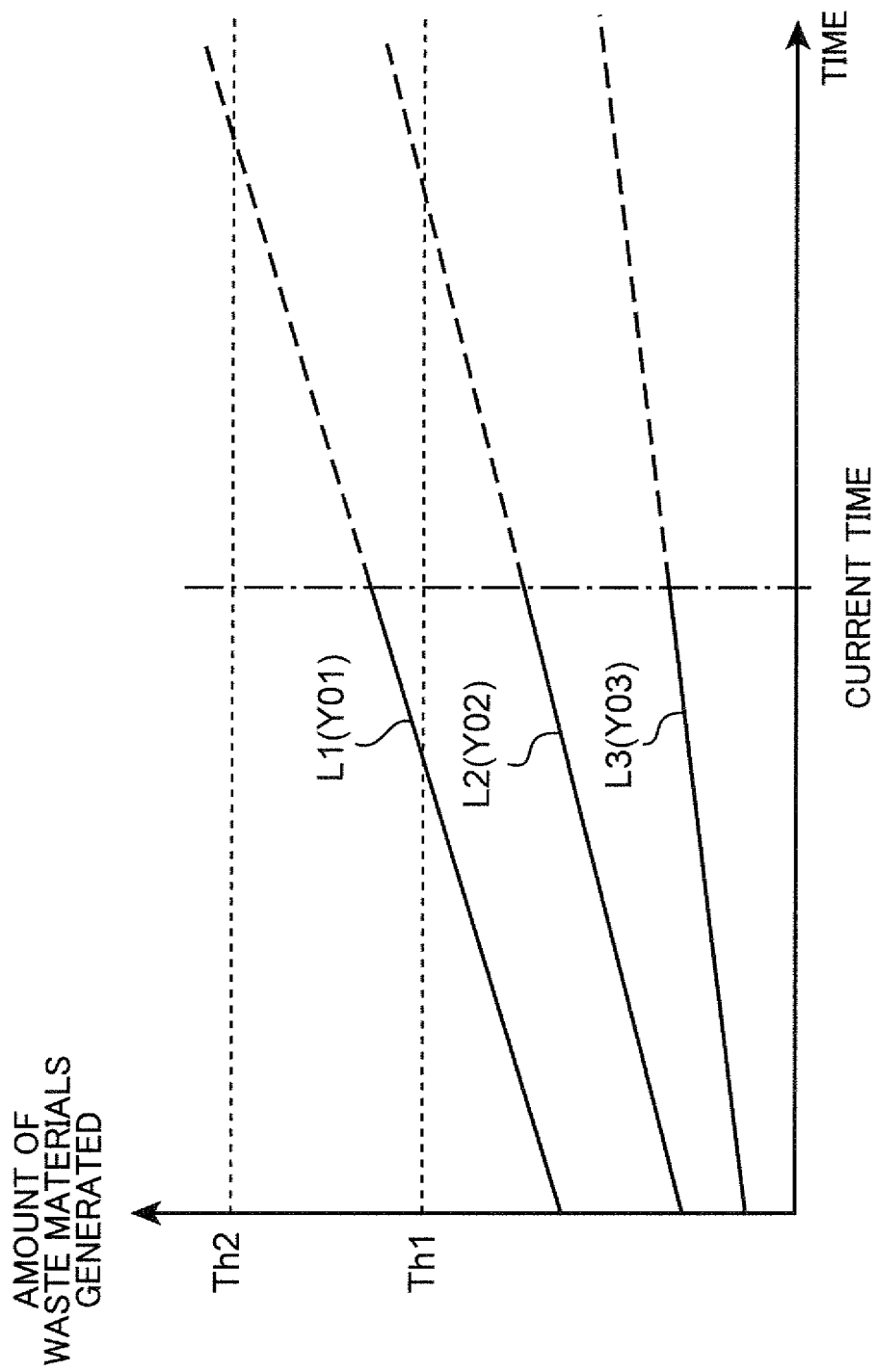
FIG. 12 is a graph for describing an example of management of waste material data by a collection management unit.

The collection management unit 66 acquires an amount of the waste materials generated predicted by the waste material generation prediction unit 67, as the waste material data for managing the collection work. FIG. 12 is a graph for describing an example of management of waste material data by the collection management unit 66. This graph shows a total amount L1 (Y01) of waste materials generated, a total amount L2 (Y02) of waste materials generated, and a total amount L3 (Y03) of waste materials generated that represent respective amounts of waste materials generated at all feeders of three mounting machines 1, i.e., a mounting machine Y01, a mounting machine Y02, and a mounting machine Y03. Actually, the total amount of waste materials generated does not increase linearly with respect to the time axis. In this graph, however, the total amount of waste materials generated in its tendency of increase is indicated in a simple form.

FIG. 12 shows an example in which a first threshold Th1 and a second threshold Th2 are set. For example, the first threshold Th1 can be set as a total amount of waste materials generated, in which the waste material collection unit of the mounting machine 1 still has room for accommodating a waste material but is recommended to execute waste material collection work. The second threshold Th2, on the other hand, can be set as a total amount of waste materials generated, in which the waste material collection unit has less room for accommodating a waste material such that an alarm for requesting execution of waste material collection work must be issued.

In the example of FIG. 12, the collection management unit 66 determines that the total amount L1 of waste materials generated of the mounting machine Y01 exceeding the first threshold Th1 at "current time" representing a time to execute a management process, is a total amount of waste materials generated for which "collection work is required".

This determination is reflected in the master data D5 (FIG. 1) by flagging or the like associated with the identification number of the mounting machine Y01. As a result, data indicating that "collection work is required" is also reflected in the work data D6 cut out from the master data D5.

According to the present embodiment, when a need of waste material collection work to be executed arises at the target mounting machine 1 to be subjected to the above "collective resupply", a work plan for the worker to execute waste material collection work, in addition to part resupply work, at the target mounting machine 1 is created. This is a main concept of the present embodiment. Specifically, the work planning unit 653 refers to a state of management of the collection work by the collection management unit 66 (see, e.g., FIG. 12), and when finding that a flag "collection work is required" is provided for the target mounting machine 1, creates the work data D6 for executing both the resupply work and the collection work at the target mounting machine 1.

Referring back to FIG. 8, the master data memory unit 681 stores the master data D5, which constitutes a base for managing the resupply work and the collection work. The work data memory unit 682 is a memory area that keeps the work data D6 cut out from the master data D5 at predetermined management timing. The work data D6 having been cut out from the master data D5 is updated independently in this work data memory unit 682. The collection data memory unit 683 is a memory area that keeps data necessary for management of waste material collection work by the collection management unit 66, the data including waste material data derived by the waste material generation prediction unit 67.

The mounting machine 1 includes a collection determining unit 17 and a waste material sensor 18 (sensor), in addition to the mounting machine control unit 10 and the collection instruction lamp 19 described above. The collection determining unit 17 carries out a process of determining whether or not to permit collection of a waste material, such as an empty reel, generated at the mounting machine 1, from the mounting machine 1. A specific example of the collection determining unit 17 will be described in detail later (FIG. 18). The waste material sensor 18 is a sensor that detects an amount of waste materials generated at the mounting machine 1. The waste material sensor 18 is disposed on the waste material collection unit of the mounting machine 1. The waste material sensor 18 is, for example, a weight sensor that measures the weight of a waste material in the collection box 54, i.e., the waste material collection unit provided in the carriage 4, or is an optical sensor that measures the volume of the waste material. The collection management unit 66 may receive detection information from the waste material sensor 18, as the waste material data, in place of or in addition to prediction data on the total amount of waste materials generated, which is obtained by the waste material generation prediction unit 67. Further, regarding the empty reels, the collection management unit 66 may also receive, as the waste material data, a flag indicating the presence of an empty reel, the flag being based on a notification of completion of ejection of the component storage tape 3 from the tape feeder 2, data indicating the absence of an empty reel, the data being based on a flag deletion notification that is issued when empty reels are collected from the collection slots 542 and 543 of the pulled out collection box 54, or data indicating the presence or absence of an empty reel, the data being based on the result of an empty reel detection by the sensor that detects an empty reel.

[Specific Example of Waste Material Collection Work]

Some specific examples in which waste material collection work is executed in combination with the "collective resupply" will hereinafter be described.

First Embodiment

Figure 13:
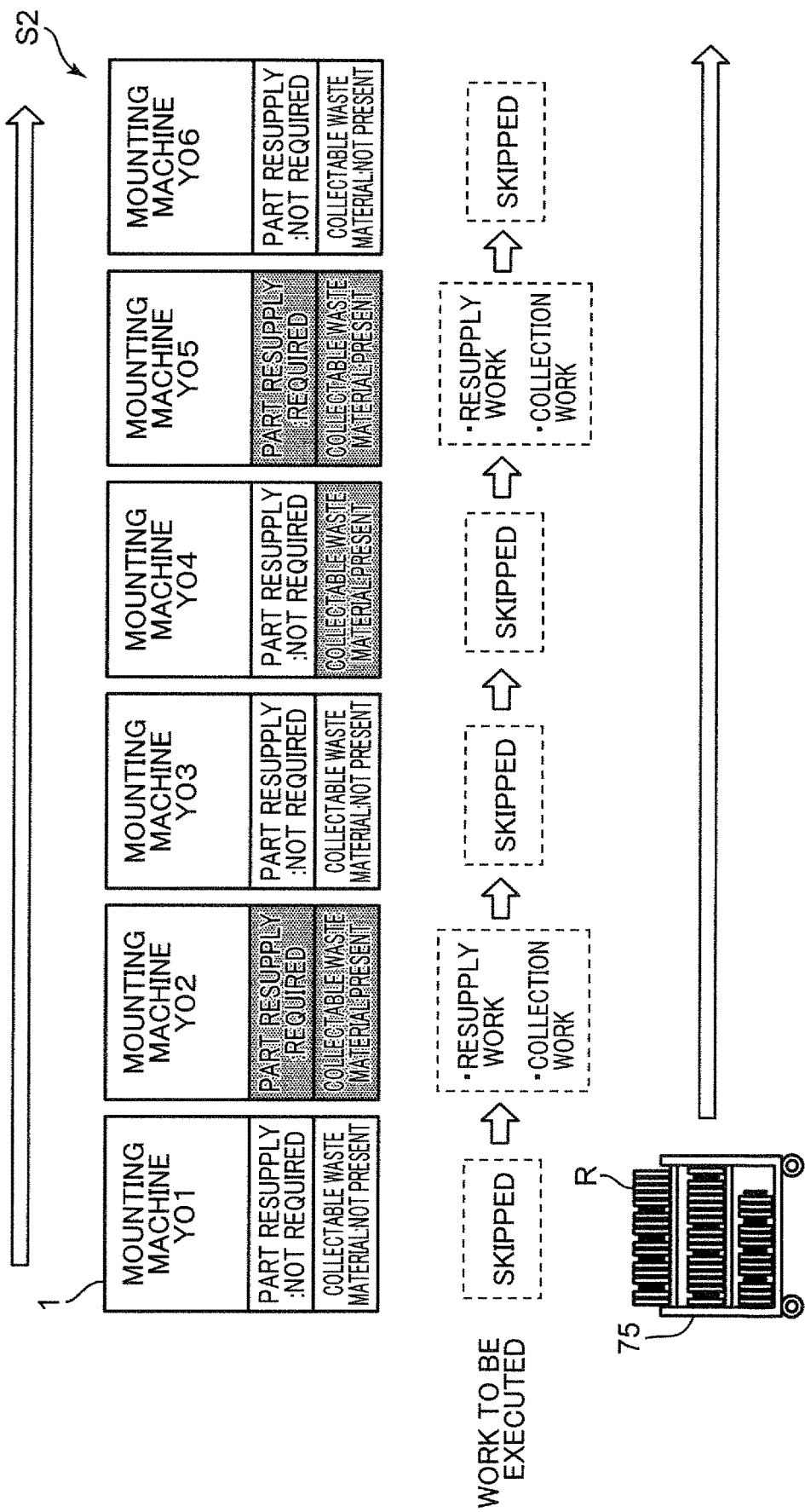
FIG. 13 shows a first embodiment of waste material collection work set up by the work management system.

FIG. 13 shows a first embodiment of waste material collection work set up by the work management system 51. FIG. 13 shows an example in which the production line S2 is configured by six mounting machines 1, i.e., mounting machines Y01, Y02, Y03, Y04, Y05, and Y06. It is assumed that a resupply patrol route is determined to be a route from the mounting machine Y01 toward the mounting machine Y06 in advance.

It is also assumed that among the mounting machines Y01 to Y06, the mounting machines Y02 and Y05 are specified as target mounting machines 1 that require component resupply work. In other words, in the case of FIG. 11, some of the tape feeders 2A to 2D specified as tape feeders to be subjected to "collective resupply" are present in the mounting machine Y02, while the rest of the tape feeders 2A to 2D are present in the mounting machine Y05, and that no tape feeder to be subjected to "collective resupply" is present in the mounting machines Y01, Y03, Y04, and Y06. In this case, at the resupply timing TH, the worker makes a resupply patrol to stop by at the mounting machines Y02 and Y05 in order, and executes resupply work of attaching resupply reels R to the tape feeders 2A to 2D in order.

Meanwhile, regarding the waste material collection work, it is assumed that the collection management unit 66 determines that "collection work is required" (collectable waste material is present) at the mounting machines Y02, Y04, and Y05. It is also assumed that at each of the other mounting machines Y01, Y03, and Y06, the total amount of waste materials generated is zero or is so small that it stays below the first threshold Th1 of FIG. 12. In this case, out of the three mounting machines at which "collection work is required", the mounting machines Y02 and Y05 are also specified as mounting machines to be subjected to "collective resupply".

In such a case, the work planning unit 653 creates the work data D6 according to a work procedure illustrated in FIG. 13. Specifically, the work planning unit 653 creates the work data D6 for carrying out the following work plan during a patrol of the mounting machines Y01 to Y06.

Mounting machine Y01=skipped (passed without carrying out work)
Mounting machine Y02=execute part resupply work and waste material collection work
Mounting machine Y03=skipped
Mounting machine Y04=skipped
Mounting machine Y05=execute part resupply work and waste material collection work
Mounting machine Y06=skipped The work data D6 is delivered to the terminal device 73 carried by the worker and to the AGV 74. While visually checking the work data D6, the worker makes a patrol of the mounting machine Y01 to the mounting machine Y06 in order, and during the patrol, executes the resupply work and the collection work at the mounting machines Y02 and Y05.

Figures 14A, 14B:
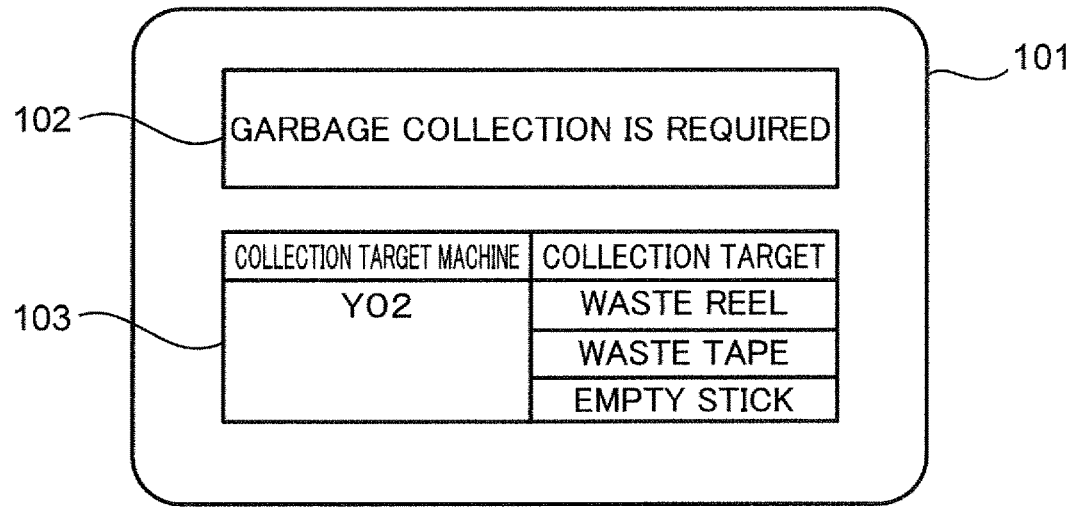
FIG. 14A shows an example of work data.
FIG. 14B shows an example of a message prompting a worker to collect waste materials, the message being displayed on a terminal device carried by the worker.

FIG. 14A shows an example of the work data D6 that is delivered to the terminal device 73 and is displayed on its display unit. The work data D6 includes resupply timing information J31, number-of-resupply-parts information J32, and resupply part information J33. The resupply timing information J31 is information indicating the result of specifying the resupply timing TH by the work planning unit 653. The number-of-resupply-parts information J32 is information indicating the total number of resupply reels R to be resupplied to the target mounting machine 1 in one "collective resupply". When "collective resupply" includes resupply of resupply trays for tray feeders and resupply sticks for stick feeders, the total number of these parts are also displayed as the number-of-resupply-parts information J32.

The resupply part information J33 is information on the resupply reel R resupplied to the tape feeder to be resupplied with the resupply reel R. The resupply part information J33 includes mounting machine type specifying information J20, component supply unit position information J34, carriage identification information J35, feeder identification information J36, part identification information J151, part type specifying information J152, and waste material collection information J37, which are associated with each other. The mounting machine type specifying information J20 is information for specifying the mounting machine 1 including the tape feeder 2 to be subjected to "collective resupply". The component supply unit position information J34 is information for specifying the positions of arrangement of the component supply units 20A to 20D, to which the tape feeders 2 to be subjected to "collective resupply" are attached, in the mounting machine 1. The carriage identification information J35 is information for identifying the carriage 75 used in the "collective resupply". The part identification information J151 and the part type specifying information J152 are the same as the part identification information J151 and the part type specifying information J152 as described in FIG. 9. The waste material collection information J37 is information indicating whether or not waste material collection work is required.

The worker, who operates the carriage 75 to make a resupply patrol, stops by at the mounting machine 1 displayed in a mounting machine type specifying information J20 entry field, and executes part resupply work. When "required" is displayed in an entry field for the waste material collection information J37 on the mounting machine 1, the worker also executes waste material collection work. In order to prevent the worker from overlooking this collection work, it is desired that "required" be displayed clearly on the display of the terminal device 73.

FIG. 14B shows an example of a message displayed on the terminal device 73. The display 101 of the terminal device 73 includes a message display field 102 and a collection work display section 103. In the message display field 102, a message prompting collection work, such as "garbage collection is required", is displayed. In the collection work display section 103, an identification number of a mounting machine at which collection work should be executed and waste materials to be collected are displayed. It is desirable that such messages and data be displayed on the terminal device 73 when the target mounting machine 1 is recognized by reading the identifier for the target mounting machine 1 or through communication between the target mounting machine 1 and the terminal device 73 during a patrol for "collective resupply".

According to the first embodiment described above, for the target mounting machine 1 specified as the mounting machine 1 to be subjected to "collective resupply", the work data D6 for executing not only the part resupply work but also the waste material collection work is created. In other words, at the target mounting machine 1 at which the worker stops by during a patrol for the resupply work, the worker can execute both the resupply work and the collection work. As a result, cases where the worker moves to the mounting machine 1 only for execution of the collection work can be reduced, and therefore the collection work can be executed efficiently in combination with the resupply work.

It should be noted that the mounting machine 1 not specified as the mounting machine 1 to be subjected to "collective resupply" is skipped during the resupply patrol, and the collection work is not carried out at such a mounting machine 1, either. In the example of FIG. 13, the mounting machine Y04 is determined to be the mounting machine at which "collection work is required" (collectable waste material is present). However, during the current resupply patrol for "collective resupply", the collection work is not executed at the mounting machine Y04. In other words, the worker does not stop by at the mounting machine 1 which requires no resupply work, even if a need of the collection work arises at such a mounting machine 1. However, because a mounting machine 1 at which a need of the resupply work never arises is usually unconceivable, the collection work may be executed in combination with the resupply work that will be required sometime in the future.

Second Embodiment

The first embodiment has shown the example in which waste material collection work is executed only at the mounting machine 1 at which part resupply work is executed. A second embodiment shows an example in which when a mounting machine 1 that does not require resupply work but allows execution of collection work is present on a resupply patrol route for "collective resupply", the worker stops by at the mounting machine 1 to execute the collection work.

Figure 15:
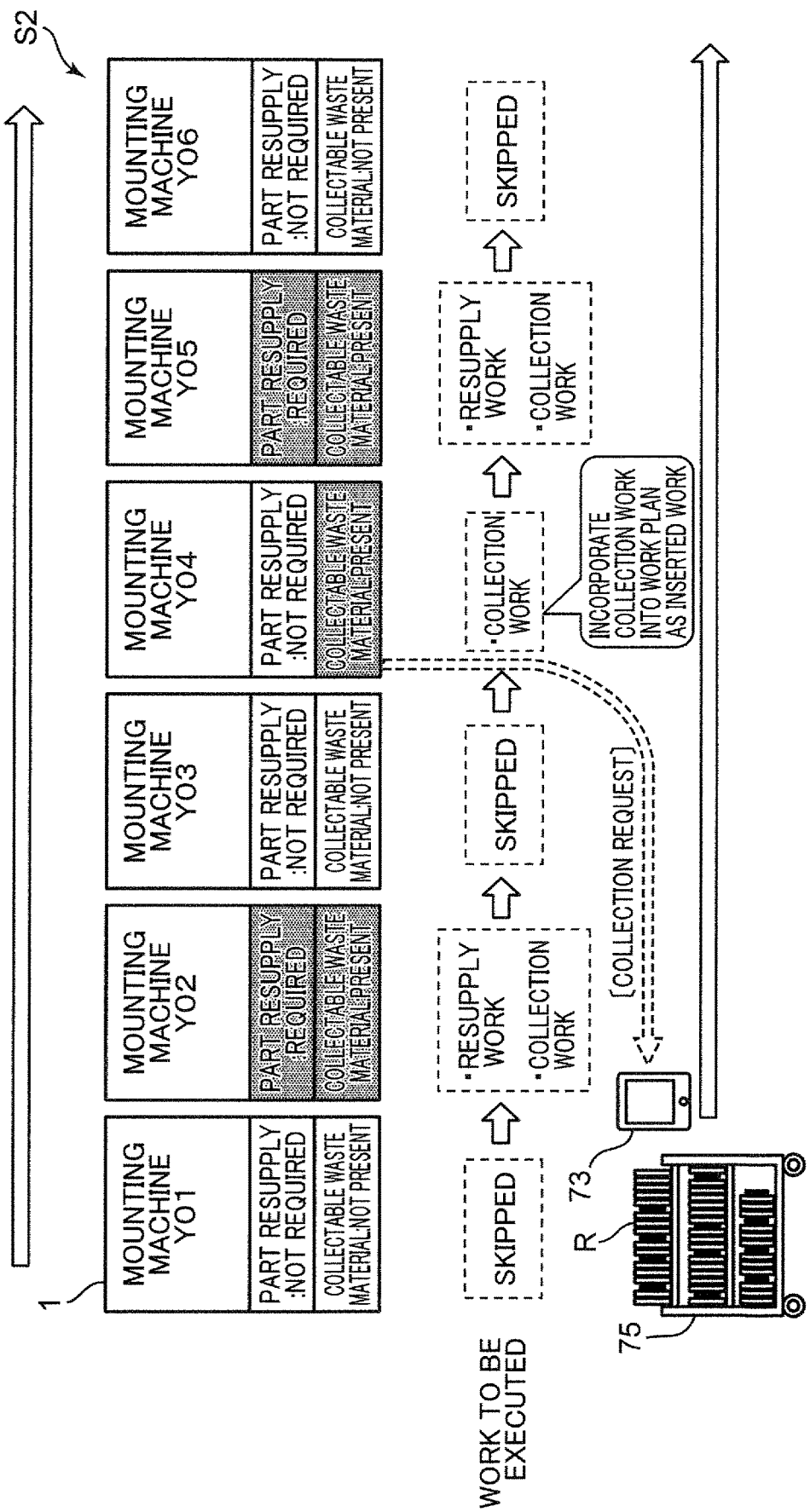
FIG. 15 shows a second embodiment of the waste material collection work.

FIG. 15 shows the second embodiment of waste material collection work set up by the work management system 51. The configuration of the production line S2, whether or not part resupply work is required, and whether or not waste material collection work is required are the same as those described in the first embodiment shown above in FIG. 13. The second embodiment is different from the first embodiment in that the work data D6 is created as data that prompts the worker to stop by at the mounting machine Y04 which is not subjected to "collective resupply" because resupply work is not required, but has a need of waste material collection work.

In the case of FIG. 15, along a resupply patrol route for "collective resupply", the worker stops by at the mounting machines Y02 and the Y05 in order. The mounting machine Y04 is a non-target mounting machine 1 at which part resupply work is not carried out, but a need of waste material collection work arises. The mounting machine Y04 is present on the resupply patrol route through which the worker makes a patrol of the mounting machines Y02 and Y05. In such a situation, executing the collection work at the mounting machine Y04 during the resupply patrol hardly reduces work efficiency. For this reason, the work data D6 is created as work data into which the collection work at the mounting machine Y04 is incorporated as inserted work.

In such a case, the work planning unit 653 creates the work data D6 according to a work procedure illustrated in FIG. 15. Specifically, the work planning unit 653 creates the work data D6 for carrying out the following work plan during a patrol of the mounting machines Y01 to Y06.

Mounting machine Y01=skipped (passed without carrying out work)
Mounting machine Y02=execute part resupply work and waste material collection work
Mounting machine Y03=skipped Mounting machine Y04=execute collection work Mounting machine Y05=execute part resupply work and waste material collection work Mounting machine Y06=skipped Incorporating the collection work at the mounting machine Y04 into the work data D6 as inserted work can be achieved by, for example, issuing a collection request from the mounting machine control unit 10 of the mounting machine Y04 to the work management system 51 or the terminal device 73. When the collection request is issued to the work management system 51, a note of the waste material collection request is attached to the mounting information D3 transmitted from the mounting machine 1. For example, the collection request is issued in a case where the waste material collection unit of the mounting machine Y04 has little room to accommodate a waste material. This collection request is reflected in the master data D5 (waste material collection information J37 shown in FIG. 14A). When the work planning unit 653 creates the work data D6 from the master data D5, when finding a mounting machine 1 that has issued a collection request despite being a non-target mounting machine 1 and that is present on the resupply patrol route for "collective resupply", like the mounting machine Y04, the work planning unit 653 incorporates resupply work for the mounting machine 1 into the work data D6, as inserted work.

When the collection request is issued to the terminal device 73, on the other hand, the work data D6 shared by the terminal device 73 and the work data memory unit 682 of the work management system 51 is updated by the collection request issued from the mounting machine 1. In other words, the work data D6 cut out from the master data D5 is updated so that collection work for the mounting machine Y04 is added to a work list of the work data D6.

Third Embodiment

In the first and second embodiments, a mode of combining resupply work for "collective resupply" with waste material collection work has been described. A third embodiment shows a different example in which a need of the collection work triggers execution of "collective resupply". The third embodiment provides a concept that when any one of the mounting machines 1 constituting the production line S2 requires urgent waste material collection work, a mounting machine 1 (tape feeders 2 and the like) at which "collective resupply" can be executed at the same timing of execution of the urgent collection work is searched for, and the work data D6 for executing the urgent collection work and "collective resupply" at the same timing is created.

Figure 16:
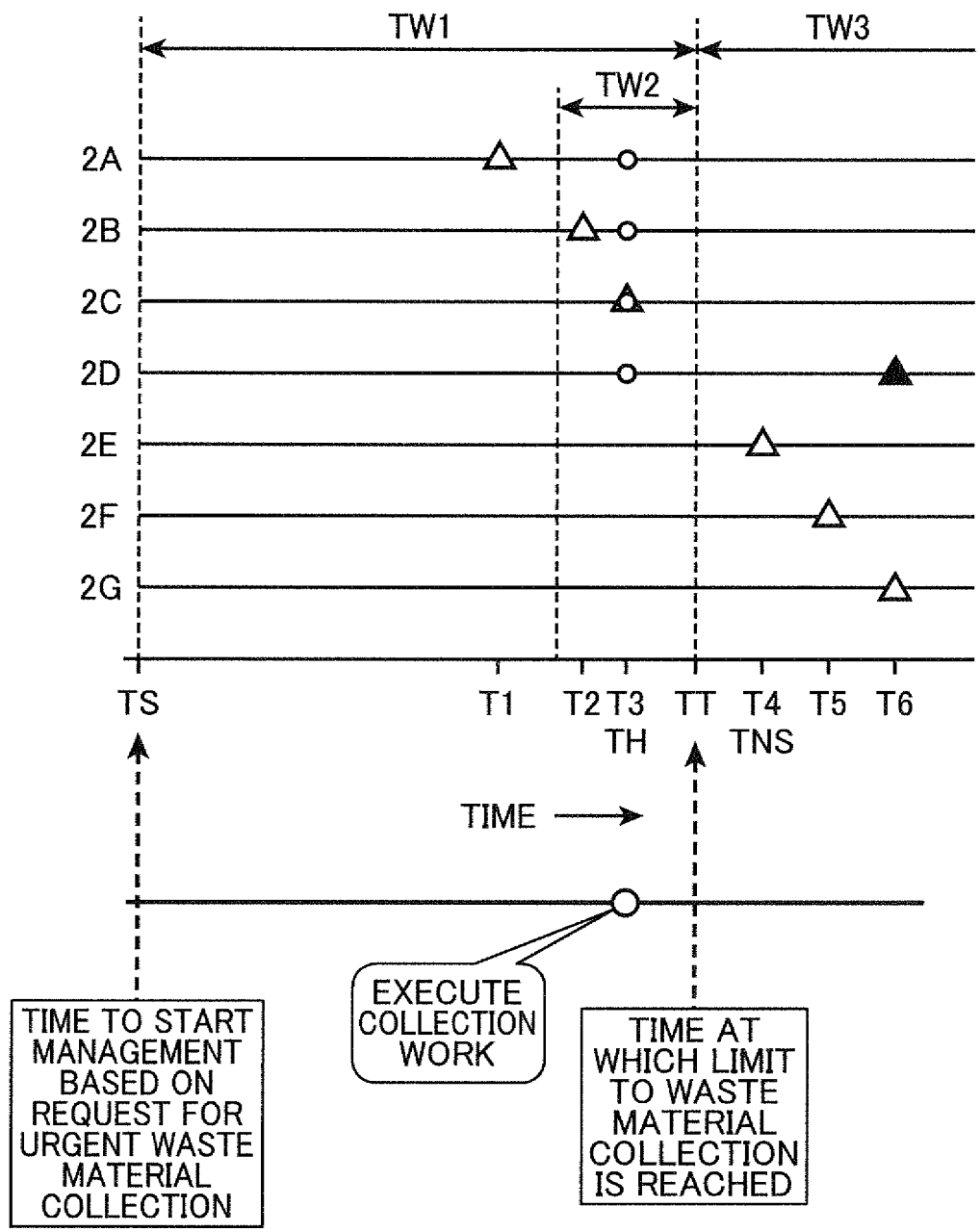
FIG. 16 shows a third embodiment of the waste material collection work.

FIG. 16 shows an example in which a mounting machine to be subjected to "collective resupply" is specified by linking "collective resupply" to urgent waste material collection work. FIG. 16 is based on FIG. 11 which has been described above. In FIG. 11, the time TS is defined as the management start time to start management of part resupply work for "collective resupply", and as the time to start production of component mounting boards or the time at which instruction information indicating the instruction to start the management is input via the operation unit 601. In contrast, according to the third embodiment, the time TS represents timing at which an urgent waste material collection request issued from any one of the mounting machines 1 constituting the production line S2 is reflected in the master data D5. In other words, the acquiring unit 64 acquires a time at which the urgent waste material collection request is received, as the management start time TS representing the time to start management of part resupply work. The urgent waste material collection request is issued when, for example, the total amount of waste materials generated exceeds the second threshold Th2 shown in FIG. 12.

The part resupply management unit 65 sets the specific time TT, using the management start time TS as a reference time. In the third embodiment, however, the specific time TT is set as a time at which the urgent collection requiring mounting machine 1, which has issued the urgent waste material collection request, reaches its limit to waste material collection. In this case, a range between the time TS and the time TT is a specific time zone in which collection work for the urgent collection requiring mounting machine 1 should be executed. The part resupply management unit 65 sets the management period TW2 (resupply time zone) in which the specific time TT is the latest time.

From among the tape feeders 2A to 2G, the work planning unit 653 specifies a feeder that can be resupplied during the management period TW2. This allows extraction of a target mounting machine 1 with a resupply work time zone overlapping the specific time zone in which collection work for the urgent collection requiring mounting machine 1 should be executed. Thus, when the target mounting machine 1 is present, the work planning unit 653 creates a work plan (work data D6) for the worker to make a patrol of the urgent collection requiring mounting machine 1 and the target mounting machine 1 and execute the urgent collection work and resupply work at the urgent collection requiring mounting machine 1 and the target mounting machine 1. In the example of FIG. 16, the time T3, which is earlier than the specific time TT, is indicated as the execution timing TH at which both the collection work and the resupply work are executed. Needless to say, when the target mounting machine 1 with the resupply work time zone overlapping the specific time zone is not present, only the urgent collection work is executed.

According to the third embodiment, the presence of the mounting machine 1 requiring urgent waste material collection work triggers extraction of the target mounting machine at which part resupply work for "collective resupply" can be executed. As a result, part resupply work can be executed in combination with waste material collection work for the urgent collection requiring mounting machine 1. Hence, cases where the worker moves only for waste material collection are reduced, which leads to the improved efficiency of the resupply work and collection work.

[Setting Timing of Execution of Collection Work]

It can be said that waste materials related to component storage members are generated constantly at each mounting machine 1. The waste material storage unit of the mounting machine 1, however, is sizable in volume, and therefore it is unnecessary to execute collection work at every cycle of patrol for part resupply executed as "collective resupply". In each of the above embodiments in which waste material collection work is executed in combination with part resupply work, how to set the timing of execution of the collection work is a main issue to address.

The work planning unit 653 of the part resupply management unit 65 refers to a collection time zone in which execution of the collection work specified by the collection management unit 66 is required and to a resupply time zone in which part resupply work specified by the resupply target specifying unit 652 can be executed, and determines whether both the resupply work and the collection work are to be executed at the target mounting machine 1 or only the resupply work is to be executed at the target mounting machine 1. In other words, the work planning unit 653 controls timing of execution of the collection work based on waste material data indicating a predicted value for a total amount of the waste materials generated, the predicted value being derived by the waste material generation prediction unit 67, or of an amount of waste materials generated detected by the waste material sensor 18. For example, the work planning unit 653 creates the work data D6 for avoiding execution of the collection work at the target mounting machine 1 whose waste material storage unit has sufficient room for accommodating a waste material while reliably executing the collection work at the target mounting machine 1 whose waste material storage unit has less room for accommodating a waste material.

Figure 17:
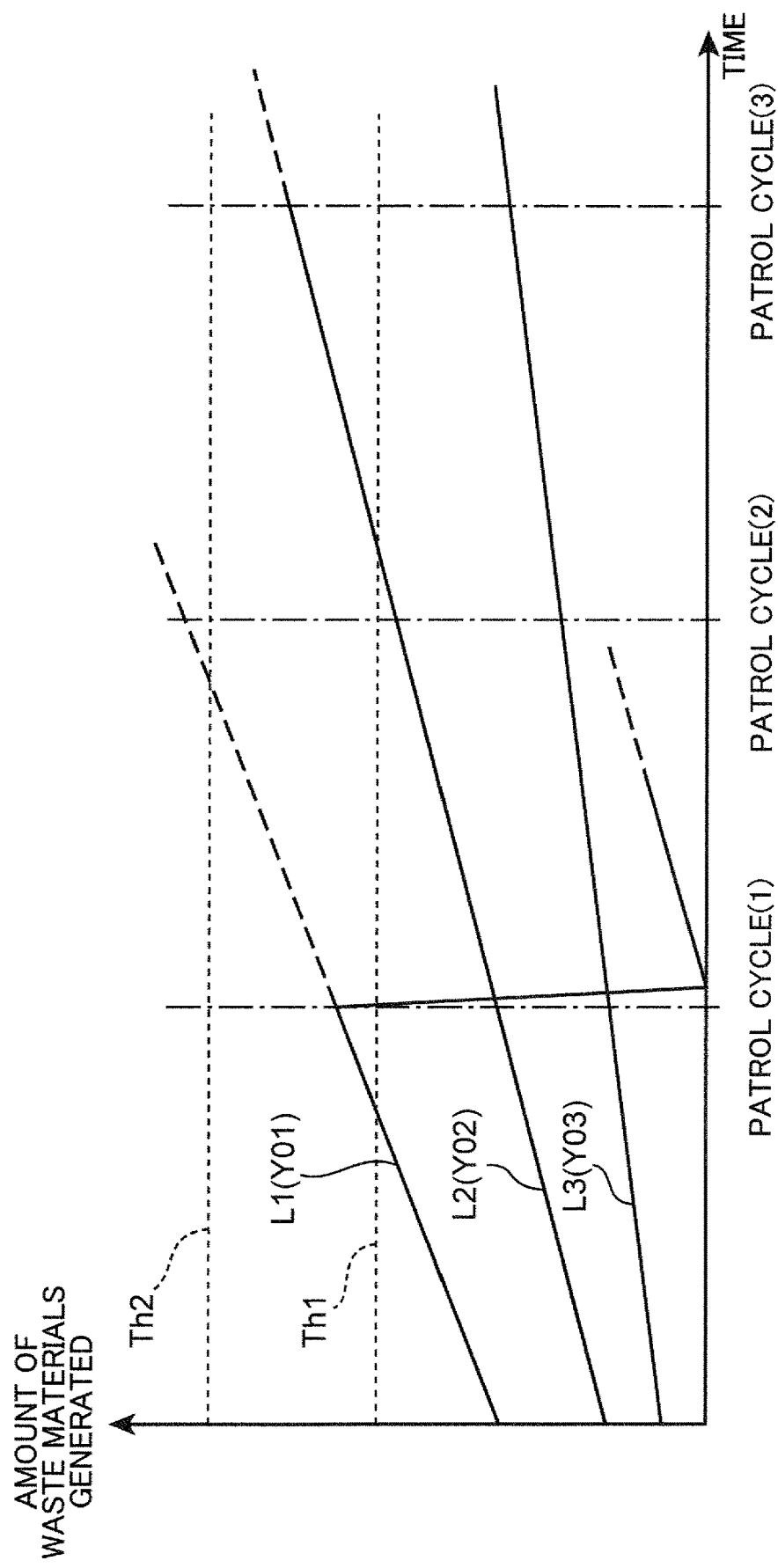
FIG. 17 is a chart showing a relationship between waste material collection timing and part resupply patrol cycles.

A specific example of setting timing of execution of collection work will be described. FIG. 17 is a diagram schematically showing a relationship between timing of collecting waste materials at each mounting machine 1 and timing of part resupply patrol. It is assumed that for each of the plurality of mounting machines 1 constituting the production line S2, resupply patrol timing, during which the resupply work is executed by patrolling, is preset to each of times of patrol cycles (1) to (3). These patrol cycles (1) to (3) each represent timing of "collective resupply" (resupply timing TH) that is estimated based on, for example, a component consumption predicted value given by the component consumption prediction unit 651.

FIG. 17 shows a predicted value for the total amount L1 (Y01) of waste materials generated at the mounting machine Y01, a predicted value for the total amount L2 (Y02) of waste materials generated at the mounting machine Y02, and a predicted value for the total amount L3 (Y03) of waste materials generated at the mounting machine Y03, the total amounts L1 (Y01), L2 (Y02), and L3 (Y03) of waste materials generated being managed by the collection management unit 66, and the first threshold Th1 and second threshold Th2 that have been described with reference to FIG. 12. At the time of the patrol cycle (1), only the total amount L1 of waste materials generated at the mounting machine Y01 exceeds the first threshold Th1, which is a threshold for recommending execution of waste material collection work. According to the predicted values, the total amount L2 of waste materials generated at the mounting machine Y02 and the total amount L3 of waste materials generated at the mounting machine Y03 are expected not to exceed the first threshold Th1 at the time of the patrol cycle (2). Meanwhile, the total amount L1 of waste materials generated exceeds the second threshold Th2, which is a threshold for issuing an alarm, at the time of the patrol cycle (2). This means that the collection time zone specified by the collection management unit 66 expires between the current patrol cycle (1) and the next patrol cycle (2).

In such a case, the work planning unit 653 creates the work data D6 for executing the collection work at the mounting machine Y01 while not executing the collection work at the mounting machines Y02 and Y03. In this case, if the mounting machine Y01 is the target mounting machine to be subjected to "collective resupply", the work planning unit 653 creates the work data D6 for executing both the resupply work and the collection work at the mounting machine Y01 (first embodiment). If the mounting machine Y01 is not the target mounting machine to be subjected to "collective resupply", the collection work for the mounting machine Y01 is incorporated into the work data D6 as inserted work (second embodiment) or the collection work for the mounting machine Y01 triggers creation of the work data D6 for "collective resupply" (third embodiment).

Focusing on the predicted value for the total amount L2 of waste materials generated at the mounting machine Y02, the predicted value does not exceed the first threshold Th1 at the time of the patrol cycle (2) but exceeds the first threshold Th1 at the time of the patrol cycle (3). For this reason, waste material collection work for the mounting machine Y02 is executed at resupply timing in the patrol cycle (2). Meanwhile, the total amount L3 of waste materials generated at the mounting machine Y03 does not exceed the first threshold Th1 not only at the time of patrol cycle (2) but also at the time of the patrol cycle (3). The mounting machine Y03 is, therefore, not subjected to waste material collection work at the resupply timing in the patrol cycle (2). In this manner, for each mounting machine 1, whether waste material collection work is to be executed at the current resupply patrol timing or is to be skipped at the current timing and executed at the next resupply patrol timing is determined. This allows an improvement in the efficiency of the collection work.

[Permission to Collect Waste Material at Mounting Machine]

The mounting machine 1 includes the collection determining unit 17 (FIG. 8) that determines whether or not to permit collection of a waste material generated at the mounting machine 1, from the mounting machine 1. Component storage members that supply components at the mounting machine 1 include a member that seems to be a waste material at a first glance but actually is a member that must not be collected as a waste material. The work planning unit 653 creates the work data D6 that specifies only the waste material, collection of which is permitted by the collection determining unit 17, as a waste material subjected to the collection work. This prevents a problem that, among waste materials generated at the mounting machine 1, a material that should not be improperly treated as waste material at present is collected mistakenly by the worker.

An example of a waste material that raises an issue of a collection period is a reel wound with the component storage tape 3 in the autoloading type tape feeder 2. The reel wound with the component storage tape 3 becomes an empty reel when the entire component storage tape 3 has been sent out, and this empty reel seems to be a waste material at a first glance. Immediately collecting the empty reel, however, may lead to a problem. This will be described with reference to FIGS. 18A to 18D.

Figure 18A:
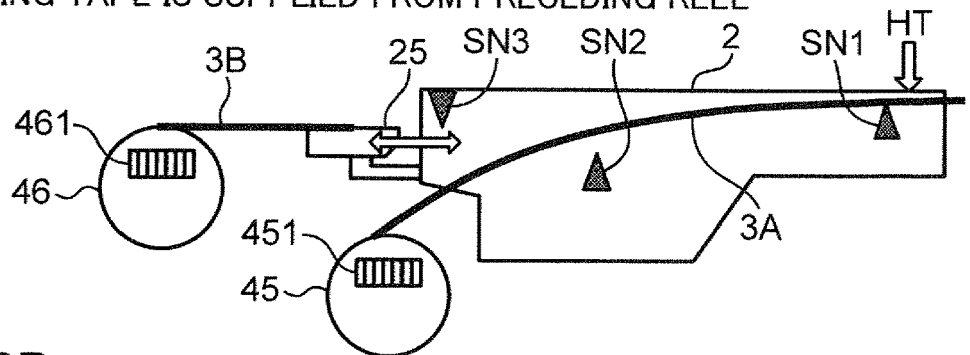
FIGS. 18A to 18D are diagrams for describing timing of giving permission to collect a reel.

FIG. 18A shows a state in which, at the autoloading type tape feeder 2, the preceding first component storage tape 3A is sent out from the first reel 45, so that the first component storage tape 3A supplies components to the component takeout position HT. The subsequent second component storage tape 3B, which is in a state of being wound around the second reel 46, has its front end set in advance on the tape attaching jig 25. The first reel 45 is provided with the first recording portion 451 (management identifier), which is a bar code or the like for recording a reel ID, and the second reel 46 is provided with the second recording portion 461 similar to the first recording portion 451. In the master data D5, the number of remaining components of the first component storage tape 3A and the number of remaining components of the second component storage tape 3B are managed in association with the reel ID indicated by the first recording portion 451 and the reel ID indicated by the second recording portion 452, respectively.

Figure 18B:
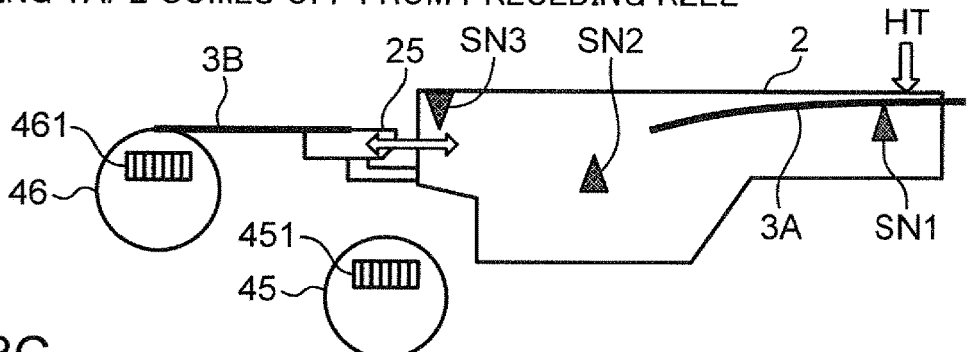

FIG. 18B shows a state in which the preceding first component storage tape 3A has been sent out entirely from the first reel 45 but the vicinity of the rear end of the first component storage tape 3A still remains in the tape feeder 2.

That is, the first reel 45 has become an empty reel but the preceding first component storage tape 3A still continues component supply. At this stage, in the case of the reel holder 41A of the first type shown in FIGS. 6A and 6B, the first reel 45 as an empty reel is held by the first holder portion 43A. In the case of the collection box 54 with reel slots of the second type shown in FIGS. 7A and 7B, the first reel 45 as an empty reel drops into the first collection slot 542. Therefore, it is considered to be a situation where the empty reel may be inevitably recognized as a waste material by the worker.

Figure 18C:
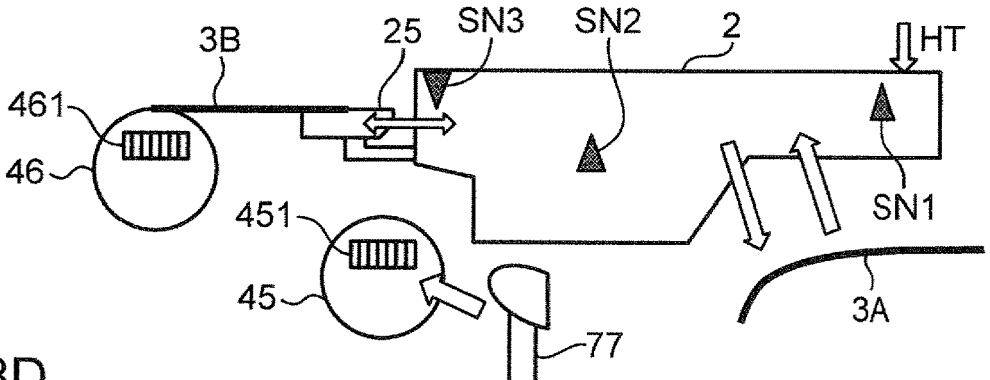

In the state of FIG. 18B, a problem with component supply may occur at the preceding first component storage tape 3A. Such a problem is, for example, a transfer failure, such as the first component storage tape 3A getting jammed, a component suction failure, or the like. When such a problem occurs, it is necessary to remove the first component storage tape 3A from the tape feeder 2, eliminate the cause of the problem, and then attach the first component storage tape 3A to the tape feeder 2 again, as shown in FIG. 18C. Upon attaching the first component storage tape 3A to the tape feeder 2 again, the worker reads the first recording portion 451 (reel ID) of the first reel 45, using the bar code reader 77. This is an essential process of causing the mounting machine 1 to know what type of a part (first component storage tape 3A) is attached to the tape feeder 2, thus causing the work management system 51 to know the same.

Collecting the first reel 45 in the state of FIG. 18B makes it impossible for the worker to execute the above process. Specifically, a problem arises that the first component storage tape 3A still having remaining components cannot be attached to the tape feeder 2 again because the worker is unable to read the reel ID. Therefore, as shown in FIG. 18B, the collection determining unit 17 does not give permission to collect the first reel 45 at a point of time at which the preceding first component storage tape 3A has been entirely sent out from the first reel 45 but taking the components out of the first component storage tape 3A has not completed yet.

Figure 18D:
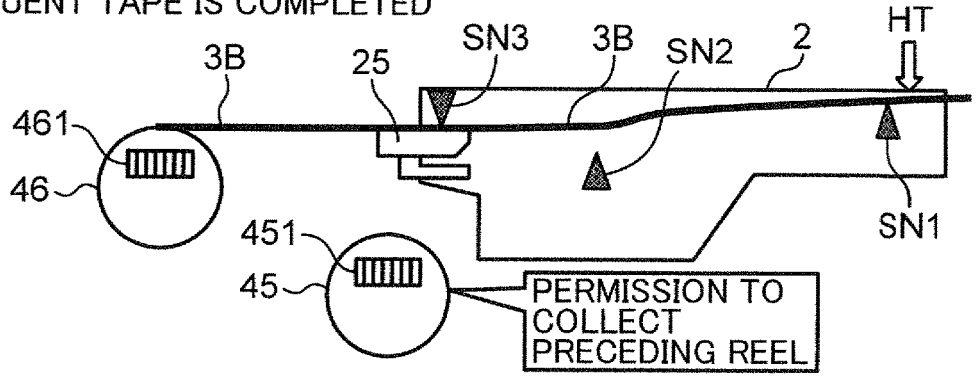

FIG. 18D shows a state in which taking the components out of the preceding first component storage tape 3A is completed (first component storage tape 3A as a waste tape has been ejected out of the tape feeder 2) and loading of the subsequent second component storage tape 3B is completed. When taking the components out of the preceding first component storage tape 3A is completed, the work of reading the first recording portion 451 of the first reel 45, using the bar code reader 77, does not arise. Thus, the collection determining unit 17 gives permission to collect the first reel 45 at the point of time at which the preceding first component storage tape 3A has been entirely sent out from the first reel 45 and taking the components out of the first component storage tape 3A is completed.

Timing of issuing the above collection permission can be set, using a detection result from the sensor included in the tape feeder 2. The tape feeder 2 includes the first sensor SN1 disposed near the component takeout position HT. At a point of time at which this first sensor SN1 detects the presence of the subsequent second component storage tape 3B, completion of loading of the second component storage tape 3B is confirmed. At this point of time, taking the components out of the first component storage tape 3A is reliably completed. The collection determining unit 17 is thus caused to make a determination on whether or not to give collection permission, depending on the detection result from the first sensor SN1, and is therefore allowed to make the determination in an accurate manner.

In addition, when a series of component takeout errors are detected in the process of the head 14H taking a component out of the first component storage tape 3A, it is determined that taking the components out of the first component storage tape 3A is completed. In this case, the first component storage tape 3A is ejected out of the tape feeder 2. Eventually, then, the first sensor SN1 detects that the first component storage tape 3A is "absent". Because the fact that taking the components out of the first component storage tape 3A is reliably completed is known at this point of time of detection of the first component storage tape 3A being "absent", the point of time of detection of the first component storage tape 3A being "absent" may be used as the point of time of issuing the collection permission.

In a preferred embodiment, when the collection determining unit 17 gives collection permission of permitting collection of the first reel 45, the mounting machine control unit 10 turns on the collection instruction lamp 19 (see FIG. 6B) corresponding to the reel holder 41A holding the first reel 45 or the collection instruction lamp 19 (see FIG. 7A) corresponding to the first collection slot 542 having the first reel 45 stored therein. The worker is thus able to immediately determine whether the first reel 45 is a collectable empty reel, based on whether the collection instruction lamp 19 is on or off.

The above specific embodiments mainly include aspects of the disclosure having the following configurations.

A work management system according to an aspect of the present disclosure is a work management system which, on a production line including a plurality of mounting machines each provided with a component supply device to which a component storage member is attachable, each of the mounting machines mounting components supplied from the component supply device on a board to produce a component mounting board, manages resupply work of resupplying each of the mounting machines with the component storage member and collection work of collecting a waste material related to the component storage member from each of the mounting machines. The work management system includes: a part resupply management unit configured to manage a plan of the resupply work for the component supply devices of the plurality of mounting machines; and a collection management unit configured to collect waste material data on a state of generation of the waste material at the plurality of mounting machines, thus managing the collection work to be executed in future, for each of the plurality of mounting machines. The part resupply management unit includes a resupply target specifying unit configured to monitor a state of component supply by each of the component supply devices, and specify a resupply time zone in which the resupply work is allowed to be executed and a target mounting machine to be subjected to the resupply work; and a work planning unit configured to extract a plurality of the target mounting machines with the resupply time zones overlapping each other, and create a work plan to make a patrol of the target mounting machines for executing the resupply work at the target mounting machines. The work planning unit refers to a state of management of the collection work by the collection management unit, and when a need of the collection work to be executed has arisen at the target mounting machine, creates a work plan to execute both the resupply work and the collection work for the target mounting machine.

According to this work management system, not only the resupply work but also the collection work is executed for the mounting machine specified as the target mounting machines. In other words, at the target mounting machine at which the worker stops by during a patrol for the resupply work, the worker can execute both the resupply work and the collection work. As a result, cases where the worker moves to the mounting machine only for execution of the collection work only can be reduced, and therefore the collection work can be executed efficiently in combination with the resupply work. It should be noted that a mounting machine with no need of the resupply work is skipped during the resupply patrol, and the collection work is not carried out at such a mounting machine, either. However, because a mounting machine at which a need of the resupply work never arises is usually unconceivable, the recollection work may be executed in combination with the resupply work that will be required sometime in the future.

In the above work management system, it is desirable that, when a need of the collection work arises at a non-target mounting machine not to be subjected to the resupply work and the non-target mounting machine is present on a route for making a patrol of the plurality of target mounting machines, the work planning unit is configured to create the work plan into which the collection work for the non-target mounting machine is incorporated as inserted work.

When the non-target mounting machine not to be subjected to the resupply work is present on the route for the worker to make a patrol of the production line for the resupply work, executing the collection work at the non-target mounting machine during the resupply patrol hardly reduces work efficiency. The above work management system, therefore, contributes to efficient waste material collection.

In the above work management system, it is desirable that when an urgent collection requiring mounting machine at which the collection work is to be executed within a specific time zone is present, the work planning unit is configured to carry out a process of extracting the target mounting machine with the specific time zone and the resupply time zone overlapping each other and when the target mounting machine is present, the work planning unit is configured to create a work plan to make a patrol of the urgent collection requiring mounting machine and the target mounting machine and execute the collection work and the resupply work at the urgent collection requiring mounting machine and the target mounting machine.

According to this work management system, the presence of the urgent collection requiring mounting machine triggers extraction of the target mounting machine at which the resupply work can be executed. The resupply work, therefore, can be executed in combination with the collection work for the urgent collection requiring mounting machine. This improves the efficiency of the resupply work.

In the above work management system, it is desirable that the collection management unit is configured to specify a collection time zone in which execution of the collection work is required, for each of the plurality of mounting machines, based on the waste material data, and that the work planning unit is configured to refer to the resupply time zone and the collection time zone for the target mounting machine and determine whether both the resupply work and the collection work are to be executed for the target mounting machine or only the resupply work is to be executed for the target mounting machine.

According to this work management system, timing of execution of the collection work can be controlled, based on the waste material data. This allows system implementation in which the collection work is avoided at the target mounting machine whose waste material storage unit has sufficient room for accommodating a waste material, while the collection work is reliably executed at the target mounting machine whose waste material storage unit has less room for accommodating a waste material.

In the above work management system, it is desirable that the plurality of mounting machines each include a sensor that detects an amount of the waste materials generated, and that the collection management unit is configured to acquire detection information from the sensor, as the waste material data.

According to this work management system, the amount of waste materials generated is directly detected by the sensor attached to the mounting machine. The collection management unit is, therefore, allowed to specify the collection time zone accurately, based on the actual amount of the waste materials generated.

It is desirable that the above work management system further include a waste material generation prediction unit configured to carry out a process of predicting the amount of the waste materials generated, based on a state of component supply by each of the component supply devices or on a production plan for producing the component mounting board, and that the collection management unit is configured to acquire, as the waste material data, the amount of waste materials predicted by the waste material generation prediction unit.

According to this work management system, the amount of waste materials generated at each mounting machine can be grasped without attaching a sensor or the like to the mounting machine.

In the above work management system, it is desirable that, in a case where resupply patrol timing, during which the resupply work is executed by patrolling, is preset for each of the plurality of mounting machines, the work planning unit is configured to cause both the resupply work and the collection work to be executed at the target mounting machine on current resupply patrol timing when the collection time zone for the target mounting machine expires between the current resupply patrol timing and next resupply patrol timing.

According to this work management system, for the target mounting machine, whether the collection work is to be executed at the current resupply patrol timing or is to be skipped at the current timing and executed at the next resupply patrol timing is determined. Thus, the collection work can be executed efficiently.

It is desirable that the above work management system further include a collection determining unit configured to determine whether or not to permit collection of the waste material generated at the mounting machine, from the mounting machine, and that the work planning unit is configured to specify only the waste material, collection of which is permitted by collection permission given by the collection determining unit, as the waste material to be subjected to the collection work.

According to this work management system, only the waste material, collection of which is permitted by the collection permission, is subjected to the collection work. This prevents a problem that among waste materials, a material that is in fact treated improperly as waste material at present is collected mistakenly by the worker.

It is preferable in this case that, when the component storage member is a component storage tape, the component supply device is a feeder of autoloading type to which a plurality of the component storage tapes are attachable, and the waste materials include a reel wound with the component storage tape and provided with a management identifier, the collection determining unit is configured to give collection permission of permitting collection of the reel at a point of time at which, at the feeder, a preceding component storage tape that is fed first has been entirely sent out from the reel and taking the components out of the preceding component storage tape is completed.

Generally, in a case where a problem with component supply or the like occurs at the preceding component storage tape and, after the problem is eliminated, the preceding component storage tape is attached to the reel again, authentication using the identifier attached to the reel may be necessary. According to the above work management system, collection permission of permitting collection of the reel is given at the point of time at which the preceding component storage tape has been entirely sent out from the reel and taking the components out of the preceding component storage tape is completed. At this point, therefore, authentication using the identifier, is not carried out. Specifically, because the collection permission is given at the point of time at which the reel is no longer usable, a problem of collecting the reel too early can be prevented.

In the above work management system, it is desirable that the mounting machine include a plurality of the component supply devices and further include display means that indicates a position of the component supply device to be subjected to the collection work.

This work management system allows the worker to reliably recognize a waste material to be collected through collection work.

A component mounting system according to another aspect of the present disclosure includes a plurality of mounting machines each provided with a component supply device to which a component storage member is attachable, each of the mounting machines mounting components supplied from the component supply device on a board to produce a component mounting board; and the above work management system that manages resupply work of resupplying each of the plurality of mounting machines with the component storage member and collection work of collecting a waste material related to the component storage member from each of the mounting machines.

The present disclosure described above provides a work management system that allows efficient execution of resupply work of resupplying a component storage member to a component supply device of a mounting machine and collection work of collecting a waste material from the mounting machine, and a component mounting system using the work management system.

What is claimed is:

1. A work management system which, on a production line including a plurality of mounting machines each provided with a component supply device to which a component storage member is attachable, each of the mounting machines mounting components supplied from the component supply device on a board to produce a component mounting board, manages resupply work of resupplying each of the mounting machines with the component storage member and collection work of collecting a waste material related to the component storage member from each of the mounting machines, the work management system comprising:
  a part resupply management unit configured to manage a plan of the resupply work for the component supply devices of the plurality of mounting machines; and
  a collection management unit configured to collect waste material data on a state of generation of the waste material at the plurality of mounting machines, thus managing the collection work to be executed in future, for each of the plurality of mounting machines,
  wherein the part resupply management unit includes:
  a resupply target specifying unit configured to monitor a state of component supply by each of the component supply devices, and specify a resupply time zone in which the resupply work is allowed to be executed and a target mounting machine to be subjected to the resupply work; and
  a work planning unit is configured to extract a plurality of the target mounting machines with the resupply time zones overlapping each other, and create a work plan to make a patrol of the target mounting machines for executing the resupply work at the target mounting machines,
  the work planning unit is configured to refer to a state of management of the collection work by the collection management unit, and when a need of the collection work to be executed has arisen at the target mounting machine, create a work plan to execute both the resupply work and the collection work for the target mounting machine, and
  when an urgent collection requiring mounting machine that requires urgent execution of the collection work is present among the plurality of mounting machines and the urgent collection requiring mounting machine issues an urgent waste material collection request, the work planning unit is configured to specify a time zone between a time at which the waste material collection request is received and a time at which the urgent collection requiring mounting machine reaches a limit to waste material collection, as a specific time zone in which the collection work is to be executed at the urgent collection requiring mounting machine, carry out a process of extracting the target mounting machine with the specific time zone and the resupply time zone overlapping each other, and when the target mounting machine is present, create a work plan to make a patrol of the urgent collection requiring mounting machine and the target mounting machine and execute the collection work and the resupply work at the urgent collection requiring mounting machine and the target mounting machine.

2. The work management system according to claim 1, wherein
  when a need of the collection work arises at a non-target mounting machine not to be subjected to the resupply work and the non-target mounting machine is present on a route for making a patrol of the plurality of target mounting machines, the work planning unit is configured to create the work plan into which the collection work for the non-target mounting machine is incorporated as inserted work.

3. The work management system according to claim 1, wherein
  the collection management unit is configured to specify a collection time zone in which execution of the collection work is required, for each of the plurality of mounting machines, based on the waste material data, and
  the work planning unit is configured to refer to the resupply time zone and the collection time zone for the target mounting machine and determine whether both the resupply work and the collection work are to be executed for the target mounting machine or only the resupply work is to be executed for the target mounting machine.

4. The work management system according to claim 3, wherein
the plurality of mounting machines each include a sensor that detects an amount of the waste materials generated, and
the collection management unit is configured to acquire detection information from the sensor, as the waste material data.

5. The work management system according to claim 3, further comprising a waste material generation prediction unit configured to carry out a process of predicting an amount of the waste materials generated, based on a state of component supply by each of the component supply devices or on a production plan for producing the component mounting board,
wherein the collection management unit is configured to acquire, as the waste material data, the amount of the waste materials predicted by the waste material generation prediction unit.

6. The work management system according to claim 3, wherein
in a case where resupply patrol timing, during which the resupply work is executed by patrolling, is preset for each of the plurality of mounting machines, the work planning unit is configured to cause both the resupply work and the collection work to be executed at the target mounting machine on current resupply patrol timing when the collection time zone for the target mounting machine expires between the current resupply patrol timing and next resupply patrol timing.

7. The work management system according to claim 1, further comprising a collection determining unit configured to determine whether or not to permit collection of the waste material generated at the mounting machine, from the mounting machine,
wherein the work planning unit is configured to specify only the waste material, collection of which is permitted by collection permission given by the collection determining unit, as the waste material to be subjected to the collection work.

8. The work management system according to claim 7, wherein
when the component storage member is a component storage tape, the component supply device is a feeder of autoloading type to which a plurality of the component storage tapes are attachable, and the waste materials include a reel wound with the component storage tape and provided with a management identifier, the collection determining unit is configured to give collection permission of permitting collection of the reel at a point of time at which, at the feeder, a preceding component storage tape that is fed first has been entirely sent out from the reel and taking the components out of the preceding component storage tape is completed.

9. The work management system according to claim 1, wherein
the mounting machine includes a plurality of the component supply devices, and further includes display unit that indicates a position of the component supply device to be subjected to the collection work.

10. A component mounting system comprising:
a plurality of mounting machines each provided with a component supply device to which a component storage member is attachable, each of the mounting machines mounting components supplied from the component supply device on a board to produce a component mounting board; and
the work management system according to claim 1, the work management system managing resupply work of resupplying each of the plurality of mounting machines with the component storage member and collection work of collecting a waste material related to the component storage member from each of the mounting machines.

11. The work management system according to claim 2, wherein
the collection management unit is configured to specify a collection time zone in which execution of the collection work is required, for each of the plurality of mounting machines, based on the waste material data, and
the work planning unit is configured to refer to the resupply time zone and the collection time zone for the target mounting machine and determine whether both the resupply work and the collection work are to be executed for the target mounting machine or only the resupply work is to be executed for the target mounting machine.

12. The work management system according to claim 2, further comprising a collection determining unit configured to determine whether or not to permit collection of the waste material generated at the mounting machine, from the mounting machine,
wherein the work planning unit is configured to specify only the waste material, collection of which is permitted by collection permission given by the collection determining unit, as the waste material to be subjected to the collection work.

13. The work management system according to claim 3, further comprising a collection determining unit configured to determine whether or not to permit collection of the waste material generated at the mounting machine, from the mounting machine,
wherein the work planning unit is configured to specify only the waste material, collection of which is permitted by collection permission given by the collection determining unit, as the waste material to be subjected to the collection work.

14. The work management system according to claim 11, further comprising a collection determining unit configured to determine whether or not to permit collection of the waste material generated at the mounting machine, from the mounting machine,
wherein the work planning unit is configured to specify only the waste material, collection of which is permitted by collection permission given by the collection determining unit, as the waste material to be subjected to the collection work.

15. The work management system according to claim 4, further comprising a collection determining unit configured to determine whether or not to permit collection of the waste material generated at the mounting machine, from the mounting machine,
wherein the work planning unit is configured to specify only the waste material, collection of which is permitted by collection permission given by the collection determining unit, as the waste material to be subjected to the collection work.

16. The work management system according to claim 5, further comprising a collection determining unit configured to determine whether or not to permit collection of the waste material generated at the mounting machine, from the mounting machine, wherein the work planning unit is configured to specify only the waste material, collection of which is permitted by collection permission given by the collection determining unit, as the waste material to be subjected to the collection work.

17. The work management system according to claim 6, further comprising a collection determining unit configured to determine whether or not to permit collection of the waste material generated at the mounting machine, from the mounting machine, wherein the work planning unit is configured to specify only the waste material, collection of which is permitted by collection permission given by the collection determining unit, as the waste material to be subjected to the collection work.

18. The work management system according to claim 2, wherein the mounting machine includes a plurality of the component supply devices, and further includes display unit that indicates a position of the component supply device to be subjected to the collection work.

19. The work management system according to claim 3, wherein the mounting machine includes a plurality of the component supply devices, and further includes display unit that indicates a position of the component supply device to be subjected to the collection work.

* * * * *